United States Patent
Fujinaga et al.

(10) Patent No.: US 6,355,387 B1
(45) Date of Patent: *Mar. 12, 2002

(54) METHOD OF MAKING A MASK PATTERN

(75) Inventors: Masato Fujinaga; Shinya Soeda, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/562,019

(22) Filed: Nov. 22, 1995

(30) Foreign Application Priority Data

Jun. 23, 1995 (JP) .............................. 7-158176

(51) Int. Cl.⁷ ............................................ H01L 21/302
(52) U.S. Cl. ............................ 430/30; 430/5; 430/321; 716/19; 716/21
(58) Field of Search .............................. 430/30, 5, 321; 364/488, 489, 490, 578, 468; 716/19, 21

(56) References Cited

U.S. PATENT DOCUMENTS 5,208,124 A * 5/1993 Sporon-Fiedler et al. ...... 430/5
5,293,577 A * 3/1994 Fujinaga et al. ............ 364/578
5,471,403 A * 11/1995 Fujimaga .................... 364/488

FOREIGN PATENT DOCUMENTS

| JP | 63-143816 | * | 6/1988 | .................. 430/30 |
| JP | 63-300516 | * | 12/1988 | .................. 430/30 |
| JP | 02-2608 | * | 1/1990 | |
| WO | 92/15924 | * | 9/1992 | .................. 430/30 |

OTHER PUBLICATIONS

Elliott, D.J., "Integrated Circuit Fabrication Technology" (© 1982) pp. 24–27 and 43–61.*

* cited by examiner

Primary Examiner—Martin Angebrannndt
(74) Attorney, Agent, or Firm—Oblon, Spivak, McClelland, Maier & Neustadt, P.C.

(57) ABSTRACT

A technique of correcting a mask pattern without alleviating the design rule or measuring all contact hole diameters. Undulations are inspected in a region for forming contact holes (step S3). On the basis of the surface shape (undulations) determined at step S3, the contact hole diameter is predicted in the case of use of the mask hole diameter fabricated at step S1 (step S4). On the basis of the result of prediction, the mask pattern M is corrected to mask patter M' according to the mask hole diameter (step S5).

19 Claims, 17 Drawing Sheets

FIG. 10

<u>S 3 2 0 ( IN THE CASE OF REGION $I_0^+$ )</u>

```
┌──────┐
│ S310 │
└──────┘
```
↓ S321

DETERMINE POSITION ($I_{IM}^+$, $J_0$) OF MAXIMUM VALUE IN REGION $I_0^+$, AND POSITION ($I_{Im}^+$, $J_0$) OF MINIMUM VALUE IN REGION $I_0^+$.

↓ S322

DETERMINE $H_{IM}^+$ BY SUBTRACTING $H(I_0, J_0)$ FROM MAXIMUM VALUE IN REGION $I_0^+$, AND $H_{Im}^+$ SUBTRACTING MINIMUM VALUE FROM $H(I_0, J_0)$ IN REGION $I_0^+$.

↓ S323

IF $H_{IM}^+ > H_{Im}^+$ THEN $\triangle H_I^+ = H_{IM}^+$, $L_I^+ = |I_0 - I_{IM}^+|$ IF $H_{IM}^+ < H_{Im}^+$ THEN $\triangle H_I^+ = -H_{Im}^+$, $L_I^+ = |I_0 - I_{Im}^+|$ IF $H_{IM}^+ = H_{Im}^+$ THEN IF $|I_0 - I_{IM}^+| < |I_0 - I_{Im}^+|$ THEN $\triangle H_I^+ = H_{IM}^+$, $L_I^+ = |I_0 - I_{IM}^+|$ IF $|I_0 - I_{IM}^+| > |I_0 - I_{Im}^+|$ THEN $\triangle H_I^+ = -H_{Im}^+$, $L_I^+ = |I_0 - I_{Im}^+|$

↓ S324

IF $\triangle H_I^+ > 0$ THEN REGION $I_0^+$ IS JUDGED TO BE IN STATE $D^+$.

IF $\triangle H_I^+ < 0$ THEN REGION $I_0^+$ IS JUDGED TO BE IN STATE $D^-$.

↓
```
┌──────┐
│ S330 │
└──────┘
```

S500 (IN CASE OF DIRECTION I)

S600

S500

METHOD OF MAKING A MASK PATTERN

BACKGROUND OF THE INVENTION

1. Field of the Invention

The present invention relates to a method for making a mask pattern, and more particularly to a method for making a mask pattern by correcting the size of a hole diameter of a mask for forming a contact hole.

2. Description of the Background Art

Making of a contact hole is indispensable in fabrication of LSI, and low precision of the hole diameter of a contact hole (hereinafter called contact hole diameter) leads to a contact failure previously control of the contact hole diameter has been attempted by correcting the mask pattern for forming a contact hole.

FIG. 24 is a flowchart showing a conventional technique of correcting the hole diameter of a mask (hereinafter called mask hole diameter) for forming a contact hole.

First, while making a mask pattern by using CAD, a check card is prepared. A check card is a collection of process flow for fabricating an LSI, specifying when to use which mask, when to make or remove which layer, etc.

Conventionally, by trial fabrication of LSI using a designed mask, the section of the LSI was observed by a microscope, and the actual contact hole diameter was measured. When the contact hole diameter was larger than a desired value, the mask hole diameter was designed smaller, and when the contact hole diameter was smaller than a desired value, the mask hole diameter was designed larger, and thus the mask pattern was corrected by such feedback.

For example, using a mask hole diameter designed to fabricate a contact hole diameter of 0.5 µm, if the actually fabricated contact hole diameter is 0.4 µm, the mask hole diameter is designed so as to fabricate a contact hole diameter of 0.6 µm. Or, if the fabricated contact hole diameter is 0.6 µm, the mask hole diameter is designed so as to fabricate a contact hole diameter of 0.4 µm.

It is, however, not practical to execute this step for all contact holes. In the LSI, there are hundreds of thousands of contact holes on one chip.

In such circumstances, it is also attempted to loosen the design rule of the LSI. The contact hole diameter depends not only on the mask hole diameter, but also on the undulations of the region for forming the contact hole, and therefore when the undulations of the region are moderate, the precision of the contact hole diameter is enhanced. Accordingly, for example, if forming of lithographic pattern is possible at 0.5 µm, then by designing the LSI by the 1 µm rule, undulations in the region for forming the contact hole are set to moderate, and hence the precision of the contact hole diameter may be enhanced. It, however, requires a wide area for realizing the LSI, and the transmission characteristic of the element deteriorates.

SUMMARY OF THE INVENTION

A first aspect of the invention relates to a method of making a mask pattern, by correcting a mask pattern used for providing an actual pattern in a processing region of an object, comprising steps of (a) making the mask pattern, (b) judging undulations of the object, (c) predicting dimensions of the actual pattern depending on the degree of the undulations, and (d) correcting by giving a correction amount to the dimensions of the mask pattern, depending on the result of the step (c).

A second aspect of the invention relates to a method of making a mask pattern of the first aspect, wherein the actual pattern is provided by forming a resist on the object, and shaping the resist depending on the mask pattern, and the step (c) includes steps of (c-1) determining the film thickness increment or decrement of the resist in the processing region, on the basis of the film thickness of the resist when the object is flat, and (c-2) predicting, on the basis of the film thickness increment or decrement, that the direction of deviation of the dimensions of the actual pattern when the processing region is concave as compared with the actual pattern when the processing region is flat, and the direction of the dimensions of the actual pattern when the processing region is convex as compared with the actual pattern when the processing region is flat are reverse to each other, and that the dimensions of the actual pattern are deviated larger when the degree of undulations of the processing region is greater as compared with when the processing region is flat.

A third aspect of the invention relates to a method of making a mask pattern of the second aspect, wherein a surface shape of the object is recognized as a surface height, relative to a foundation region expanding at least in a first direction and a second direction reverse to the first direction, and the step (b) includes steps of (b-1) determining the surface height by simulation, (b-2) specifying the position of the processing region in the foundation region, (b-3) setting a first region expanding in the first direction from the processing region, and a second region expanding in the second direction from the processing region, (b-4) detecting whether a first state of the surface height tending to increase relative to the first direction or a second state tending to decrease relative to the first direction is present, in both the first and second regions, on the basis of the result of the step (b-1), and (b-5) judging undulations about the first and second directions in the processing region on the basis of the result of the step (b-4).

A fourth aspect of the invention relates to a method of making a mask pattern of the third aspect, wherein the step (b-4), respectively in the first and second regions, has steps of (b-4-1) determining a position for taking the maximum value of the surface height, (b-4-2) determining a position for taking the minimum value of the surface height, (b-4-3) determining a shape height by subtracting the surface height of the processing region from the maximum value, (b-4-4) determining a shape depth by subtracting the minimum value from the surface height of the processing region, (b-4-5) judging a presence of the first state when the shape height is greater than the shape depth, and (b-4-6) judging a presence of the second state when the shape height is smaller than the shape depth.

A fifth aspect of the invention relates to a method of making a mask pattern of the fourth aspect, wherein the step (b-4-5) comprises, when the shape height is greater than the shape depth, a step of (b-4-5-1) taking the shape height as a first value, the step (b-4-6) comprises, when the shape height is smaller than the shape depth, a step of (b-4-6-1) taking the value multiplying the shape depth by (−1) as the first value, the step (c-1) has steps of (c-1-1) obtaining an altitude amount at an intermediate value of the first value of the first region and the first value of the second region, and (c-1-2) determining the film thickness increment or decrement on the basis of the altitude amount, and the absolute value of the film thickness increment or decrement is greater when the absolute value of the altitude amount is greater, and the sign of the altitude amount and the sign of the film thickness increment or decrement are different from each other, in the step (c-1-2).

A sixth aspect of the invention relates to a method of making a mask pattern of the fifth aspect, wherein the step (c-1-1) comprises a step of (c-1-1-1) obtaining an slope amount at an intermediate value of the value of dividing the first value in the first region by the second value in the first region, and the value of dividing the first value in the second region by the second value in the second region, and the film thickness increment or decrement is determined also on the basis of the slope amount in the step (c-1-2), and the absolute value of the film thickness increment or decrement is greater when the absolute value of the slope amount is greater.

A seventh aspect of the invention relates to a method of making a mask pattern of the fourth aspect, wherein the step (b-4-5) comprises, when the shape height is greater than the shape depth, steps of (b-4-5-1) taking the shape height as a first value, and (b-4-5-2) taking the distance along the first direction between the processing region and the position obtained in the step (b-4-1) as a second value, the step (b-4-6) comprises, when the shape height is smaller than the shape depth, steps of (b-4-6-1) taking the value multiplying the shape depth by (−1) as the first value, and (b-4-6-2) taking the distance along the first direction between the processing region and the position determined in the step (b-4-2) as the second value, the step (c-1) has steps of (c-1-1) obtaining an altitude amount at either the first value in the first region or the first value in the second region, on the basis of the magnitude relation between a third value obtained by dividing the first value in the first region by the second value in the first region, and a fourth value obtained by dividing the first value in the second region by the second value in the second region, and (c-1-2) determining the film thickness increment or decrement on the basis of the altitude amount, and the absolute value of the film thickness increment or decrement is greater when the absolute value of the altitude amount is greater in the step (c-1-2), and the sign of the altitude amount and the sign of the film thickness increment or decrement are different from each other.

An eighth aspect of the invention relates to a method of making a mask pattern of the seventh aspect, wherein the step (c-1-1) comprises a step of (c-1-1-1) taking either the third value or the fourth value as the slope amount, on the basis of the magnitude relation of the third value and the fourth value, and the film thickness increment or decrement is determined also on the basis of the slope amount in the step (c-1-2), and the absolute value of the film thickness increment or decrement is greater when the absolute value of the slope amount is greater.

A ninth aspect of the invention relates to a method of making a mask pattern of the second aspect, wherein the step (c-2) includes a step of (c-2-1) determining a pattern increment or decrement deviated when compared with the actual pattern in the case that the dimension of the actual pattern is flat in the processing region, on the basis of the film thickness increment or decrement, and an index showing a characteristic to an irradiation ray for photosensitizing the resist.

A tenth aspect of the invention relates to a method of making a mask pattern of the third aspect, wherein the foundation range further expands in a third direction orthogonal to the first and second directions, and a fourth direction opposite to the third direction, a third region expanding from the processing region in the third direction, and a fourth region expanding from the processing region in the fourth region are further set in the step (b-3), presence or absence of the first state and the second state with respect to the third direction is further detected in the third and fourth regions in the step (b-4), undulations about the third and fourth directions in the processing region are further judged in the step (b-5), and the dimension of the actual pattern about the third and fourth directions is also predicted, together with the dimension of the actual patter about the first and second directions in the step (c-1).

An eleventh aspect of the invention relates to a method of making a mask pattern of the second aspect, wherein the surface shape of the object is understood as a surface height to a foundation region expanding in direction I and direction J orthogonal thereto, and the step (b) includes steps of (b-1) determining the surface height by simulation, (b-2) specifying the position of the processing region in the foundation range, (b-3) setting a first region expanding in a positive direction from the processing region, and a second region expanding in a negative direction from the processing region, with respect to the direction I and direction J, respectively, (b-4) detecting whether the surface height is in a first state in increasing tendency or in a second state in decreasing tendency, about the positive direction, in the first and second regions, with respect to the direction I and direction J, respectively, on the basis of the result of the step (b-1), and (b-5) judging undulations about the direction I and direction J of the processing region on the basis of the result of the step (b-4).

A twelfth aspect of the invention relates to a method of making a mask pattern of the eleventh aspect, wherein the step (b-4) has, respectively in the first and second regions, steps of (b-4-1) determining a position for taking the maximum value of the surface height, (b-4-2) determining a position for taking the minimum value of the surface height, (b-4-3) determining a shape height by subtracting the surface height of the processing region from the maximum value, (b-4-4) determining a shape depth by subtracting the minimum value from the surface height of the processing region, (b-4-5) judging the presence of the first state when the shape height is greater than the shape depth, and (b-4-6) judging the presence of the second state when the shape height is smaller than the shape depth.

A thirteenth aspect of the invention relates to a method of making a mask pattern of the twelfth aspect, wherein the step (b-4-5) comprises, when the shape height is greater than the shape depth, steps of (b-4-5-1) taking the shape height as a first value, and (b-4-5-2) taking the distance along the first direction between the processing region and the position obtained in the step (b-4-1) as a second value, the step (b-4-6) comprises, when the shape height is smaller than the shape depth, steps of (b-4-6-1) taking the value multiplying the shape depth by (−1) as the first value, and (b-4-6-2) taking the distance along the first direction between the processing region and the position determined in the step (b-4-2) as the second value, the step (c-1) comprises steps of (c-1-1) obtaining, respectively about the direction I and direction J, an altitude amount candidate at either the first value in the first region or the first value in the second region, on the basis of the magnitude relation between a third value obtained by dividing the first value in the first region by the second value in the first region, and a fourth value obtained by dividing the first value in the second region by the second value in the second region, (c-1-2) taking, respectively about the direction I and direction J, either the third value or the fourth value as a slope amount candidate, on the basis of the magnitude relation between the third value and the fourth value, (c-1-3) taking the altitude amount candidate corresponding to the one with the greatest absolute value among the plural altitude amount candidates as the altitude amount, and (c-1-4) determining the film thickness increment or decrement on the basis of the altitude amount, and the absolute value of the film thickness increment or decrement is greater when the absolute value of the altitude amount is greater in the step (c-1-4), and the sign of the altitude amount and the sign of the film thickness increment or decrement are different from each other.

A fourteenth aspect of the invention relates to a method of making a mask pattern of the thirteenth aspect, wherein the step (c-1-3) comprises a step of (c-1-3-1) taking the one with the greatest absolute value among the plural slope amount candidates as the slope amount, and the film thickness increment or decrement is determined also on the basis of the slope amount in the step (c-1-4), and the absolute value of the film thickness increment or decrement is greater when the absolute value of the slope amount is greater.

A fifteenth aspect of the invention relates to a method of making a mask pattern of the thirteenth aspect, wherein the steps (b-3), (b-4), (c-1-1), and (c-1-2) are executed also in first and second directions orthogonal to each other in a stretching plane of the direction I and direction J, crossing at an equal angle with both the direction I and direction J.

A sixteenth aspect of the invention relates to a method of making a mask pattern of the first aspect, wherein the mask pattern is edited on a screen in the step (d), and a caution is visually alerted on the screen at a position where the absolute value of the correction amount exceeds a specific upper limit.

A seventeenth aspect of the invention relates to a method of making a mask pattern of the second aspect, wherein the step (c-1) includes:

(c-1-1) a resist application simulation step for simulating the mode of the resist being disposed on the object.

An eighteenth aspect of the invention relates to a method of making a mask pattern of the second aspect, wherein the step (c-2) has steps of (c-2-1) determining an equal strength plane by performing strength distribution simulation on irradiation ray for photosensitizing the resist, and (c-2-2) estimating the shape of the resist when the resist is developed, from the equal strength plane.

A nineteenth aspect of the invention relates to a method of making a mask pattern of the first aspect, wherein the actual pattern is provided by forming a resist on the object, and shaping the resist according to the mask pattern, and the step (c) includes a step of simulating the shaping.

In the invention, meanwhile, "mask pattern" refers to the data for controlling whether or not the resist is exposed, including the data for controlling the particle rays directly drawn on the resist.

According to the mask pattern making method of the first aspect of the invention, predicting the effect of the surface shape of the object on the dimension of the actual pattern, it is fed back to the mask pattern.

Therefore, a mask pattern to obtain the actual pattern in the dimensions of the desired value can be made without actually processing the object.

According to the mask pattern making method of the second aspect of the invention, a thicker resist is formed when the degree of concavity in the processing region is stronger, and a thinner resist is formed when the degree of convexity is stronger. When the resist is thicker, the irradiation ray for changing the developing characteristic of the resist, for example, the light is absorbed more. Since the resist receives the irradiation ray from the opposite side of the processing region, the area of the resist receiving the irradiation ray passing through the mask pattern becomes smaller as going toward the processing region.

Therefore, the effectively masked region in the processing region expands, and the interval of the regions to be masked becomes narrower, so that the dimensions of the actual pattern can be predicted.

According to the mask pattern making method of the third aspect of the invention, when the first region ($I_0^+$) is in the first state ($D^+$), and the second region ($I_0^-$) is in the second state ($D^-$), the surface height increases as going toward the processing region along the first direction, and the surface height decreases after passing through the processing region, so that the processing region can be judged to be convex.

To the contrary, when the first region ($I_0^+$) is in the second state ($D^-$), and the second region ($I_0^-$) is in the first state ($D^+$), the surface height decreases as going toward the processing region along the first direction, and the surface height increases after passing through the processing region, so that the processing region is judged to be concave.

Therefore, the undulations in the processing region can be easily judged by simulation without trial fabrication.

According to the mask pattern making method of the fourth aspect of the invention, in the first and second regions, presence of the first or second state is judged by taking note of the maximum value and minimum value of the shape of the object.

Therefore, the undulations in the processing region are judged macroscopically, without being affected by a slight error in simulation of the shape of the object.

According to the mask pattern making method of the fifth aspect of the invention, the altitude amount is determined in consideration of both the first value of the first region and the first value of the second region.

Therefore, the altitude amount is determined depending on the degree of change of the processing shape of the first and second regions for determining the undulations, and the film thickness increment or decrement is set depending on the magnitude of the altitude amount, so that the effect of the first aspect can be easily obtained while considering the contribution of the processing shape of both first and second regions to the thickness of the resist.

According to the mask pattern making method of the sixth aspect of the invention, the slope amount is determined in consideration of both the first value of the first region and the first value of the second region.

Therefore, the film thickness increment or decrement is set depending not only on the magnitude of the altitude amount but also on the slope amount, so that the mask pattern can be correctly more precisely while considering the contribution of the processing shape of both first and second regions to the thickness of the resist.

According to the mask pattern making method of the seventh aspect of the invention, the third value refers to the degree of change, including the sign, of the shape of the object in the first region. The fourth value refers to the degree of change, including the sign, of the shape of the object in the second region.

Therefore, the altitude amount is determined depending on the degree of change of the processing shape of both first and second regions for determining undulations, and the film thickness increment or decrement is set depending on the magnitude of the altitude amount, so that the effect of the fourth aspect can be easily obtained while considering which one of the contribution of the processing shape of the first and second regions is dominant for the thickness of the resist.

According to the mask pattern making method of the eighth aspect of the invention, the slope amount refers to the degree of change, including the sign, of the shape of the object in the first and second regions.

Therefore, the film thickness increment or decrement is set not only on the magnitude of the altitude amount, but also on the slope amount, so that the mask pattern can be corrected more precisely.

According to the mask pattern making method of the ninth aspect of the invention, the irradiation ray is absorbed more when the resist is thicker, depending on the characteristic of the resist.

Therefore, by determining the pattern increment or decrement on the basis of the index, the prediction at step (c) of the first aspect can be realized.

According to the mask pattern making method of the tenth aspect of the invention, the dimensions of actual patterns are predicted respectively in two directions orthogonal to each other, so that the mask pattern can be corrected in consideration of these two directions.

Therefore, a rectangular pattern having parallel sides in two directions orthogonal to each other can be corrected easily.

According to the mask pattern making method of the eleventh aspect of the invention, undulations are judged respectively in two directions orthogonal to each other, so that the mask pattern can be corrected in consideration of these two directions.

Therefore, an more accurately mask pattern correction can be done easily.

According to the mask pattern making method of the twelfth aspect of the invention, in the first and second regions, presence of the first or second states is judged by taking note of the maximum value and minimum value of the shape of the object.

Therefore, the undulations of the processing region are judged macroscopically, without being affected by a slight error in simulation of the shape of the object.

According to the mask pattern making method of the thirteenth aspect of the invention, the third value refers to the degree of change, including the sign, of the shape of the object in the first region. The fourth value refers to the degree of change, including the sign, of the shape of the object in the second region.

Therefore, the altitude amount is determined depending on the degree of change of the processing shape of both first and second regions for determining undulations, and the film thickness increment or decrement is set depending on the magnitude of the altitude amount, so that the effect of the eleventh aspect can be easily obtained while considering which one of the contribution of the processing shape of the first and second regions is dominant for the thickness of the resist.

According to the mask pattern making method of the fourteenth aspect of the invention, the slope amount refers to the degree of change, including the sign, of the shape of the object in the first and second regions.

Therefore, the film thickness increment or decrement is set not only on the magnitude of the altitude amount, but also on the slope amount, so that the mask pattern can be corrected more precisely.

According to the mask pattern making method of the fifteenth aspect of the invention, undulations are judged in four directions mutually crossing at 45 degrees each, and step (c) is executed with the undulations relating to the direction of the greatest degree of undulations.

Therefore, the undulations are judged in more directions, so that the mask pattern can be correctly more precisely.

According to the mask pattern making method of the sixteenth aspect of the invention, the caution is visually alerted on the screen, so that the position requiring an excessive amount of correction can be easily known.

Therefore, the mask pattern can be corrected by easy operation.

According to the mask pattern making method of the seventeenth aspect of the invention, the film thickness of the resist is accurately determined in the resist application simulation step.

Therefore, the film thickness of the resist can be determined accurately, so that the dimensions of the actual pattern can be also predicted more accurately.

According to the mask pattern making method of the eighteenth aspect of the invention, the shape after development of the resist can be accurately determined in the strength distribution simulation step.

According to the mask pattern making method of the nineteenth aspect of the invention, the shape of the resist can be accurately determined in the simulation step.

Therefore, the shape of the resist can be determined accurately, and hence the dimensions of the actual pattern can be predicated more accurately.

It is therefore an object of the present invention to solve the problems and provide a technique for correcting the mask pattern without loosening the design rule or measuring all contact hole diameters.

These and other objects, features, aspects and advantages of the present invention will become more apparent from the following description of the present invention when taken in conjunction with the accompanying drawings.

BRIEF DESCRIPTION OF THE DRAWINGS

FIG. 10 is a flowchart explaining the first preferred embodiment of the invention.

DESCRIPTION OF THE PREFERRED EMBODIMENTS

A. First Preferred Embodiment (A-1) General Description

Figure 1:
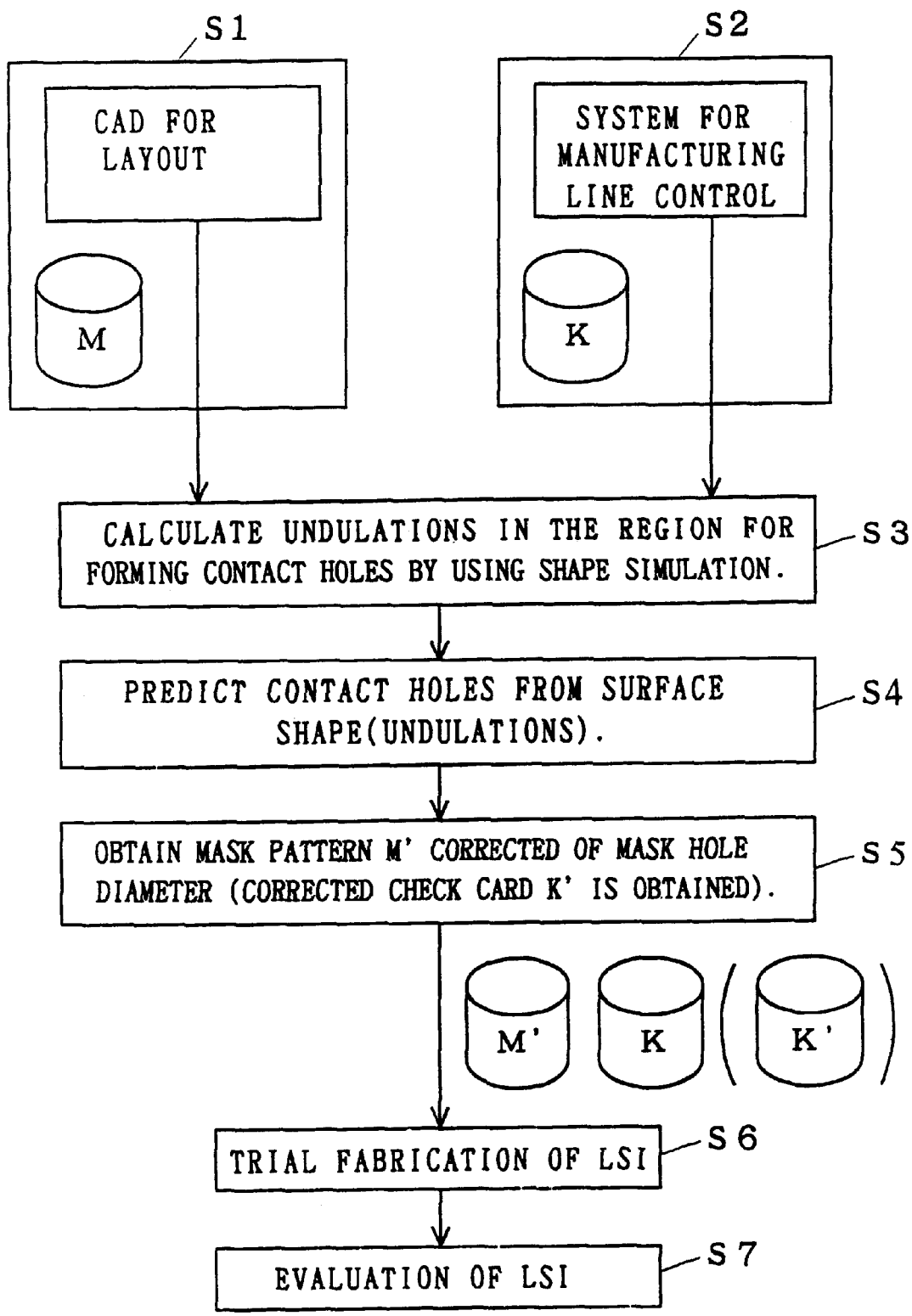
FIG. 1 is a flowchart explaining a first preferred embodiment of the invention.

FIG. 1 is a flowchart showing a first preferred embodiment of the invention. A mask pattern M for LSI fabrication is prepared by using a CAD for layout (step S1), while a check card K is prepared by using a system for manufacturing line control (step S2). Afterwards, according to the check card K, the shape obtained through the process of etching, deposition, and reflow is simulated, and undulations of the region or forming contact holes are determined (step S3).

Furthermore, on the basis of the surface shape (undulations) determined at step S3, the contact hole diameter obtained when the mask hole diameter fabricated at step S1 is predicted (step S4). According to the result of prediction, the mask pattern M is corrected to mask pattern M' as for mask hole diameter (step S5). Later, using this mask pattern M', a trial product of LSI can be manufactured (step S6). If it is also necessary to correct the check card K, a corrected check card K' can be obtained before step S6.

As for shape simulation at step S3, a known art can be employed. For example, a three-dimensional shape simulation is described in "3D Lithography, Etching, and Deposition Simulation (SAMPLE-3D)" (E. W. Scheckler et al., VLSI Technology Digest, pp. 97–98, 1991). The present applicant also disclosed a shape simulation method in Japanese Patent Laid-open Gazette No. 4-133326.

Figure 2:
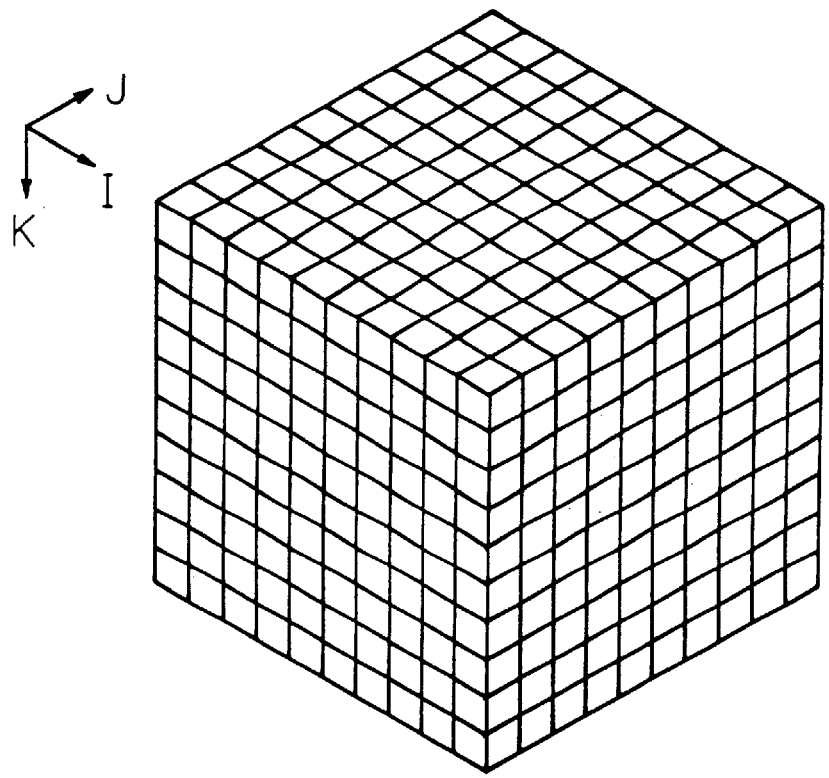
FIG. 2 is a perspective view explaining the concept used in shape simulation.
Figure 3:
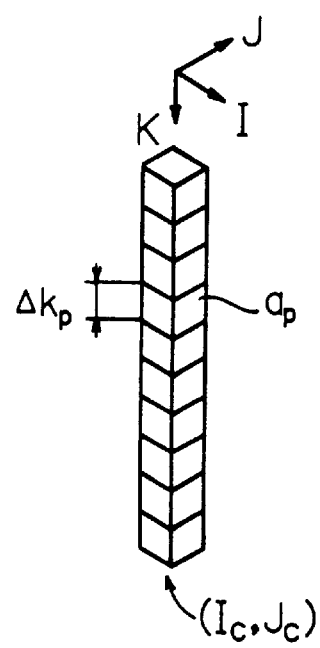
FIG. 3 is a perspective view explaining the concept used in shape simulation.

FIG. 2 and FIG. 3 are perspective views showing the concept employed in the shape simulation. The region for shape simulation is divided into orthogonal meshes as shown in FIG. 2. In each rectangular parallelepiped cell divided by orthogonal meshes, the existence rate of substance is calculated. For example, when the region is divided by three mutually orthogonal axes I, J, K, the substance height $H(I_c, J_c)$ in K direction at a specific position $(I_c, J_c)$ on a plane stretched in directions I, J is determined by the sum of the substance existence rate $a_p$ ($0 \leq a_p \leq 1$) of the cell existing at position $(I_c, J_c, K_p)$ (p=1, 2, 3, . . . )

$$H(I_c, J_c) = \Sigma a_p \cdot \Delta k_p$$

where $\Delta k_p$: width in direction K of the cell existing at position $(I_c, J_c, K_p)$.

While updating the specific position $(I_c, J_c)$ on the plane stretched in directions I, J, by determining its height $H(I_c, J_c)$, a plane shape can be simulated.

Figure 4:
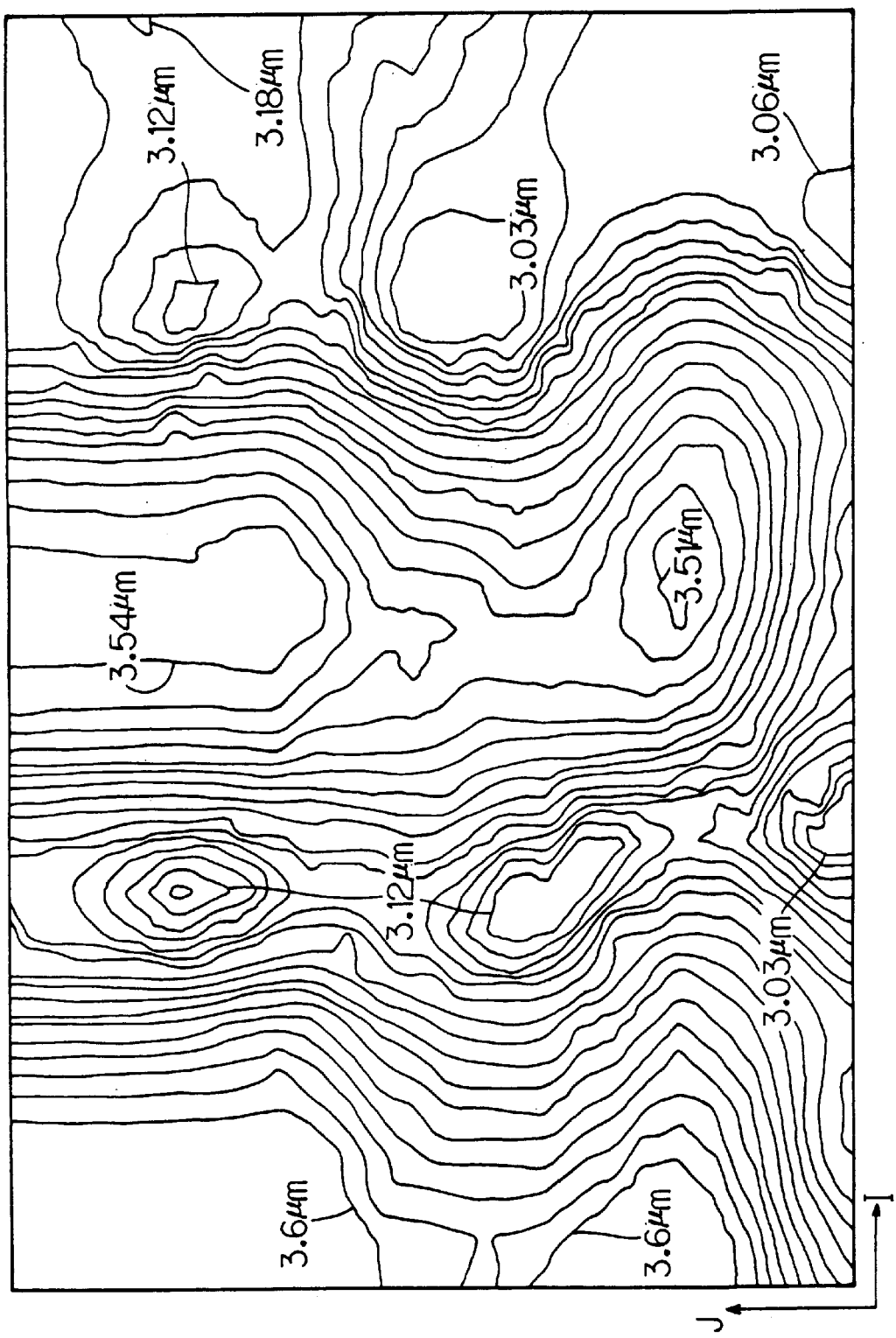
FIG. 4 is a contour map showing an example of result of shape simulation.

FIG. 4 is a contour map showing an example of result of shape simulation. Such contour map is obtained by performing shape simulation. In FIG. 4, contour lines are drawn at intervals of 0.03 µm in regions having expansions of 14.5 µm and 12.5 µm in direction I and direction J, respectively.

Figure 5:
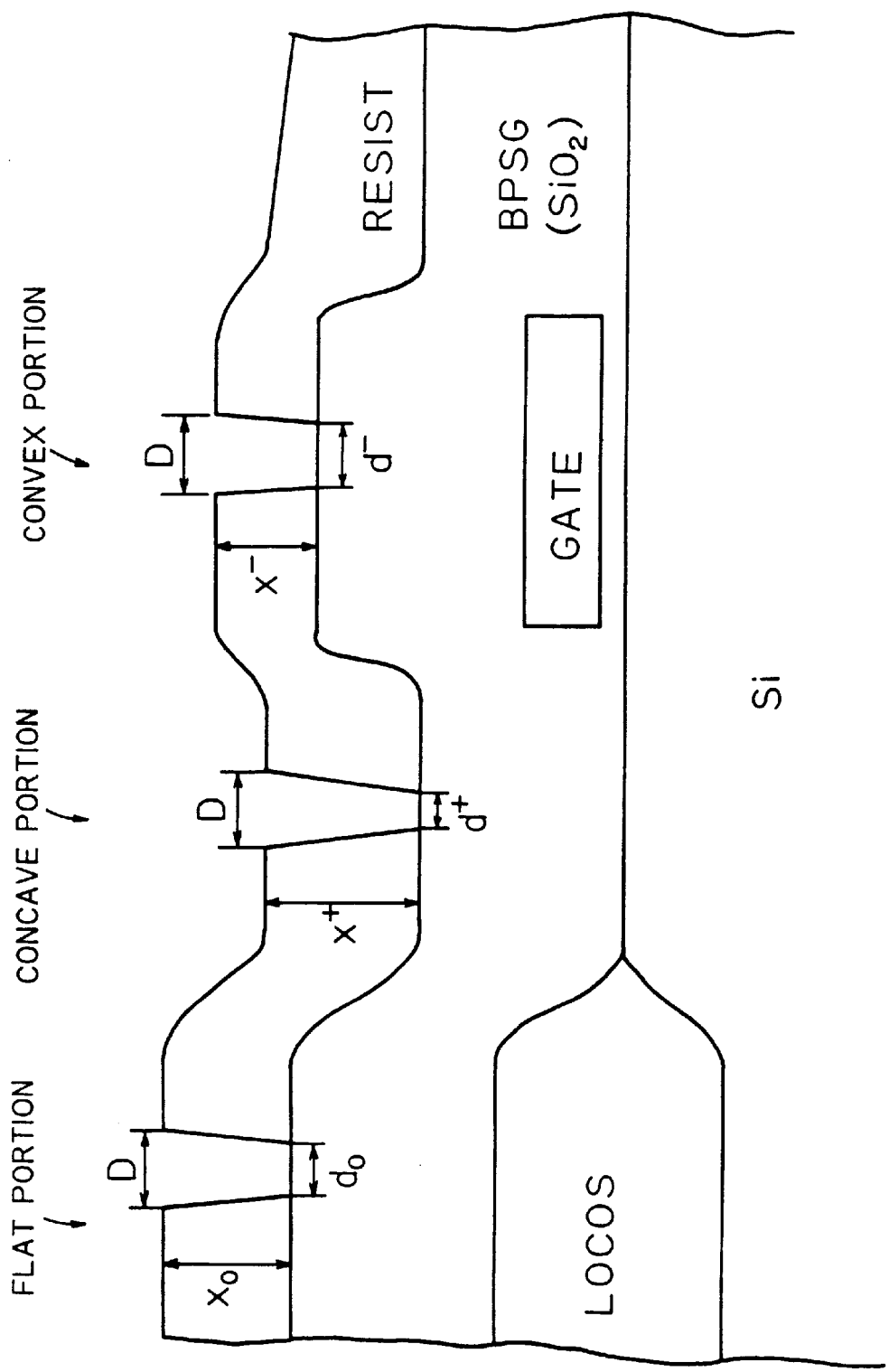
FIG. 5 is a sectional view of a semiconductor element explaining a basic idea of the first preferred embodiment of the invention.

FIG. 5 is a sectional view of a semiconductor element showing a basic idea of step S4. On a silicon substrate, a LOCOS film is formed selectively, and a gate electrode is provided above the silicon substrate where the LOCOS film is not formed. On the silicon substrate, a silicon oxide film is formed, and further a BPSG film is formed by reflow.

In the semiconductor element having a sectional profile as shown in FIG. 5, when forming contact holes by piercing the BPSG film, the resist is selectively removed after once forming a resist on the BPSG film. That is, by shaping the resist, its base surface of BPSG film is patterned. By etching the BPSG film according to this pattern, contact holes can be provided.

Meanwhile, owing to the presence of LOCOS film and gate electrode, the BPSG film has undulations. The result obtained at step S3 expresses the undulations. Because of the presence of undulations in the base, the film thickness of the resist is not uniform.

In FIG. 5, the BPSG film is formed relatively flat on the LOCOS film, and the resist is formed at film thickness $x_0$. On the other hand, the BPSG film enclosed by the LOCOS film and gate electrode has a concave portion, and the film thickness $x^+$ of the resist formed in this area is greater than the film thickness $x_0$. To the contrary, the BPSG film formed near the gate electrode has a convex portion, and the film thickness $x^-$ of the resist formed in this area is smaller than the film thickness $x_0$.

Such deviation in the film thickness of the resist induces deviation of pattern obtained by shaping the resist. The thicker the resist, the more is absorbed the irradiation ray (for example, light) for varying the developing characteristic of the resist. Light is emitted to the resist from the opposite side of the BPSG film, that is, from above in FIG. 5, and therefore the area of the resist receiving the light passing through the mask pattern is decreased as going toward the BPSG film.

For example, in any one of the flat part, concave part, and convex part shown in FIG. 5, suppose to shape the resist by using the mask pattern showing transmission of light at diameter D. For example, the diameter of the pattern given by the resist to the BPSG film in the flat part is $d_0$. When the resist is of positive type, the diameter $d^+$ of the pattern given by the resist to the BPSG film in the concave part is smaller than the diameter $d_0$. To the contrary, the diameter $d^-$ of the pattern given by the resist to the BPSG film in the convex part is greater than $d_0$.

Such effect of the resist film thickness on the diameter of the pattern given to the BPSG film is, as a matter of course, more manifest when the degree of concave or convex property is greater.

In the light of such tendency, at step S4, the contact hole diameter is predicted from the surface shape of the base of the resist such as the BPSG film.

At step S5, when the contact hole diameter predicted at step S4 is greater than the desired diameter, the mask hole diameter is corrected smaller depending on the degree. To the contrary, when the predicted contact hole diameter is smaller than the desired diameter, the mask hole diameter is corrected larger depending on the degree.

The invention is intended to correct the mask pattern in such procedure, and it is neither necessary to loosen the design rule, nor necessary to measure all contact hole diameters.

(A-2) Detail of step S4

Figure 6:
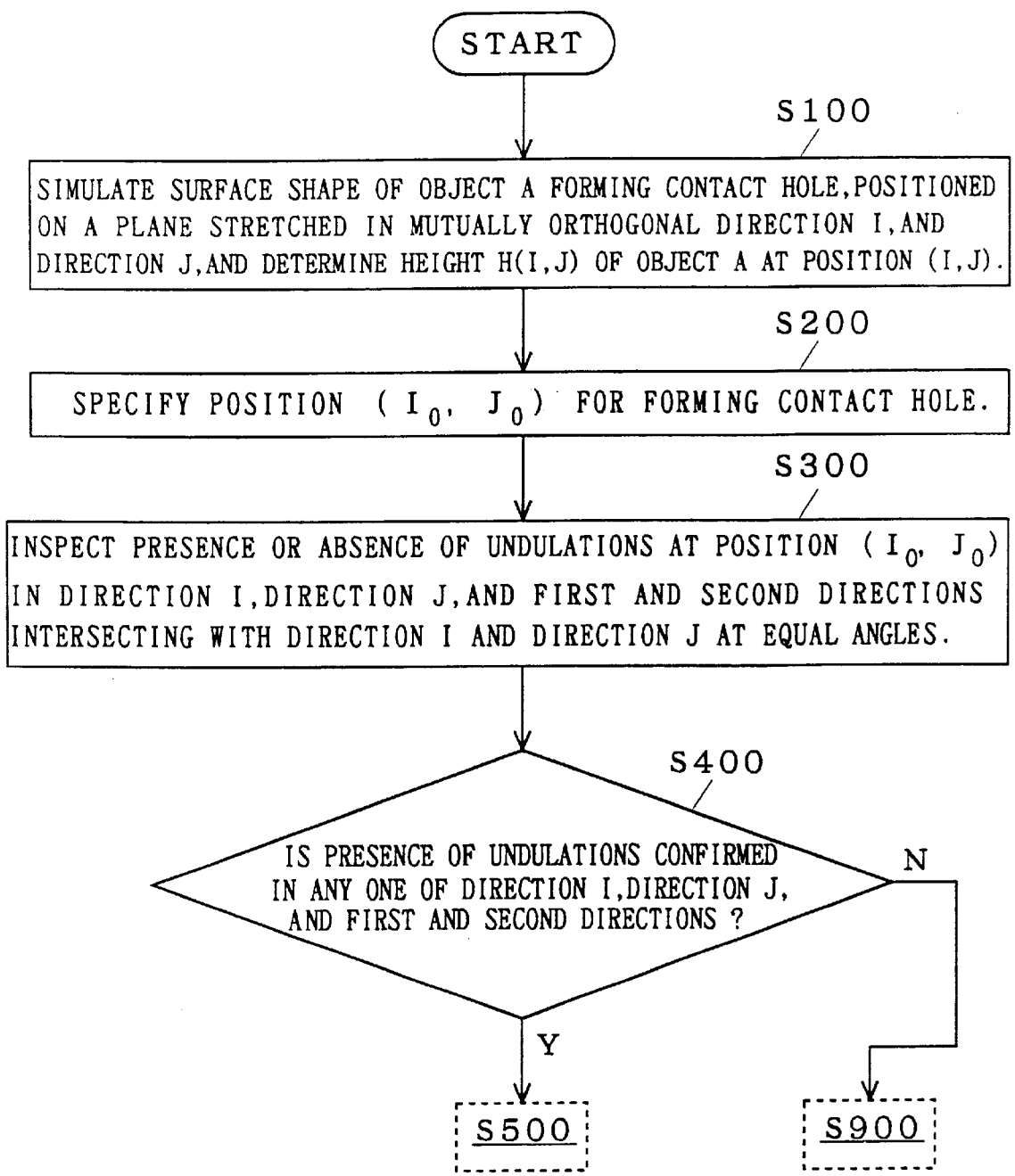
FIGS. 6 to 8 are flowcharts explaining the first preferred embodiment of the invention.
Figure 7:
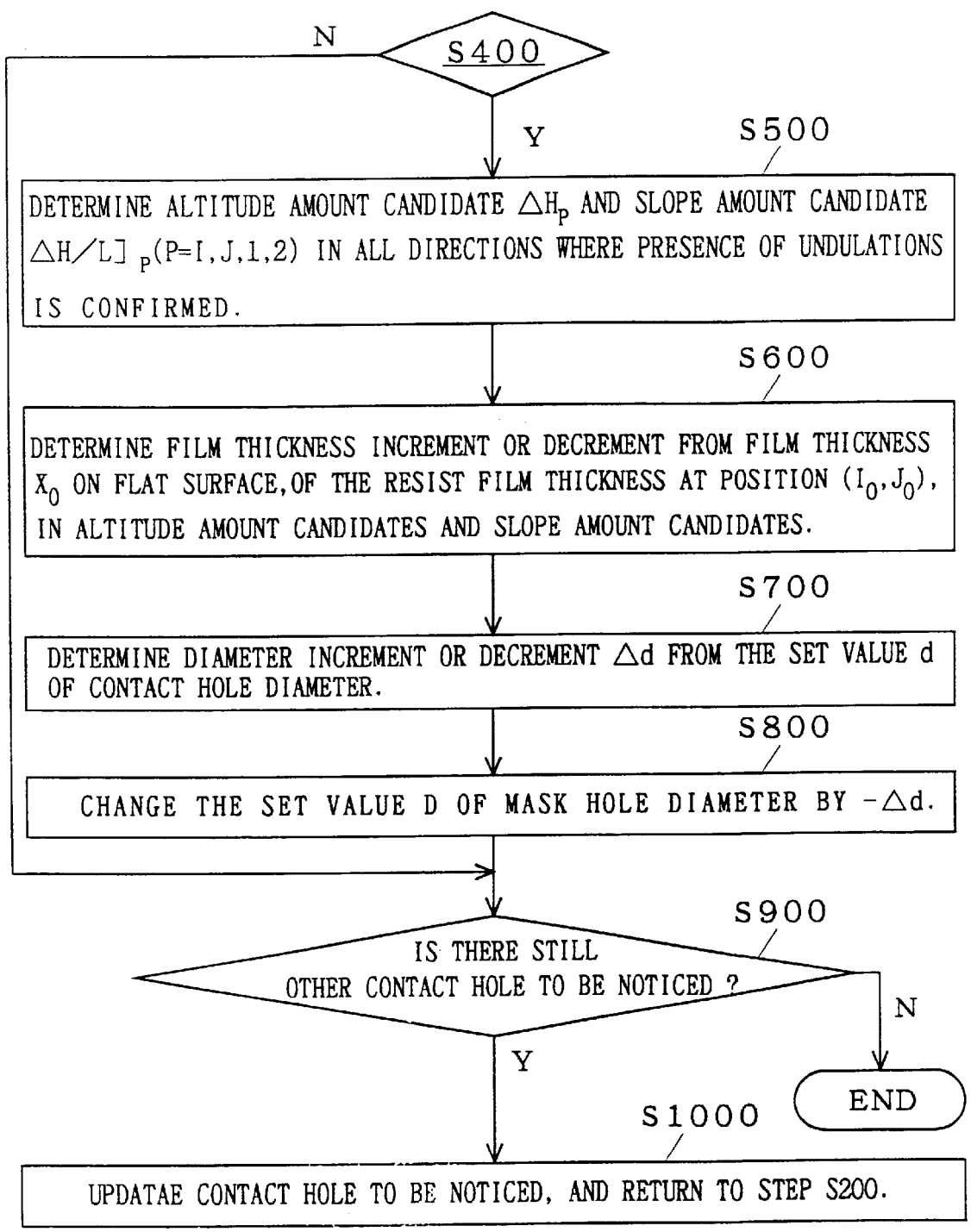

FIG. 6 and FIG. 7 are flowcharts showing the detail of step S3 and step S4. Step S100 corresponds to step S3, and steps S200 to S1000 denote the detail of step S4.

At step S100, as explained above, shape simulation is performed. Referring to FIG. 5, a plane orthogonal to the thickness direction of the resist is taken on a plane stretched in directions I, J (plane IJ). The surface of the object A corresponds to the BPSG film. Hence, height H (I, J) indicates the surface shape of the BPSG film.

At step S200, the position $(I_0, J_0)$ for forming a contact hole is specified. This is to inspect the undulations at this position.

Consequently, at step S300, presence or absence of undulations at the position $(I_0, J_0)$ in various directions is inspected. This is to inspect the presence or absence of undulations not only in direction I and direction J, but in mutually orthogonal first and second directions within a plane stretched in directions I, J, intersecting at equal angle (45 deg., 135 deg.) in both direction I and direction J.

Next, at step S400, the operation is advanced to step S500 when undulations are confirmed in any one of these four directions, and to step S900 when undulations are not observed in any direction.

At step S500, concerning each direction in which presence of undulations is confirmed, the altitude amount candidate $\Delta H_p$ and slope amount candidate $\Delta H/L]_p$ (p=I, J, 1, 2) are determined. These values indicate the degree of undulations, and are described in detail in the next section.

At step S600, on the basis of the altitude amount candidate and slope amount candidate, the film thickness increment or decrement $\Delta X$ from the film thickness $X_0$ on a flat surface of the resist film thickness at position $(I_0, J_0)$ is determined. Referring to FIG. 5, for example, the differences between thicknesses $x^+$, $x^-$, and $X_0$ are determined. They are determined, as explained in the preceding section, according to the tendency that the resist is formed thick in the concave portion, and thin in the convex portion.

Further at step S700, the diameter increment or decrement $\Delta d$ from the set value d of the contact hole diameter is determined. Referring to FIG. 5, for example, the differences between diameters $d^+$, $d^-$ and $d_0$ are determined. They are determined, as explained in the preceding section, according to the tendency that the actual contact hole diameter is smaller when the resist is thicker.

At step S800, consequently, on the basis of the diameter increment or decrement $\Delta d$, the set value of mask hole diameter is corrected. Herein, the diameter increment or decrement $\Delta d$ is subtracted from the actual size D of the mask actually fabricated as mask pattern. When the mask pattern is used in a reticle enlarged more than the actual size, of course, the correction is done according to the rate of enlargement. Furthermore, when exposing by directly drawing an electron beams on the resist, the mask pattern is the data for determining the rate of deflection of electron beams, and in such a case the degree of deflection is corrected according to the diameter increment or decrement $\Delta d$.

All such correction of mask hole diameter is done on the contact hole. That is, if there is still another contact hole to be investigated at step S900, the contact hole of notice is updated to return to step S200, and when correction of all contact holes is over, the correction process is over. Thereafter, step S5 is executed.

(A-3) Detail of step S300

Figure 8:
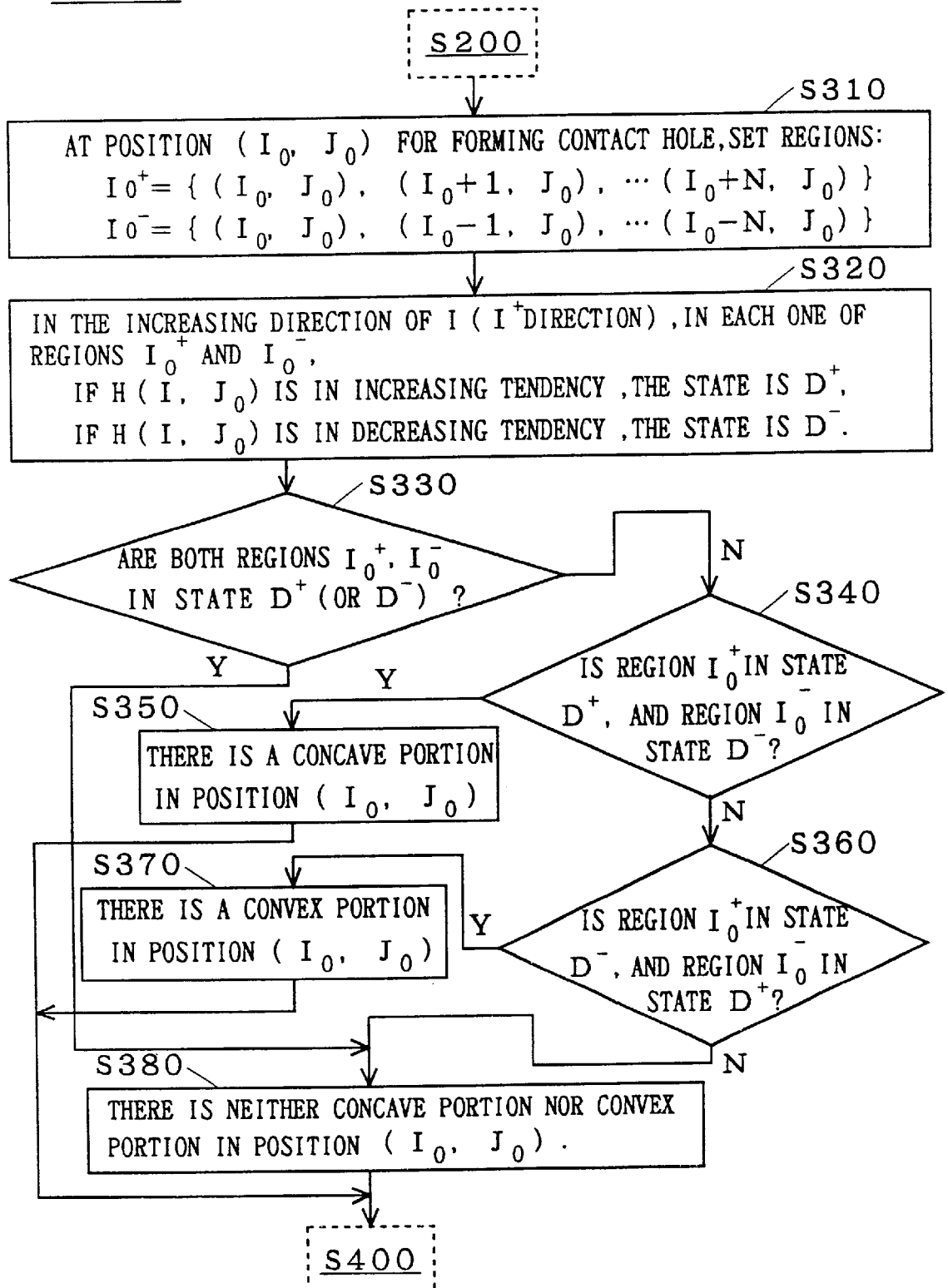

FIG. 8 is a flowchart showing the detail of step S300. Here is shown only an example of inspection for presence or absence of undulations in direction I. In direction J and first and second directions, undulations are inspected similarly.

First at step S310, regions $I_0^+$, $I_0^-$ are set for the contact hole forming position $(I_0, J_0)$.

Figure 9:
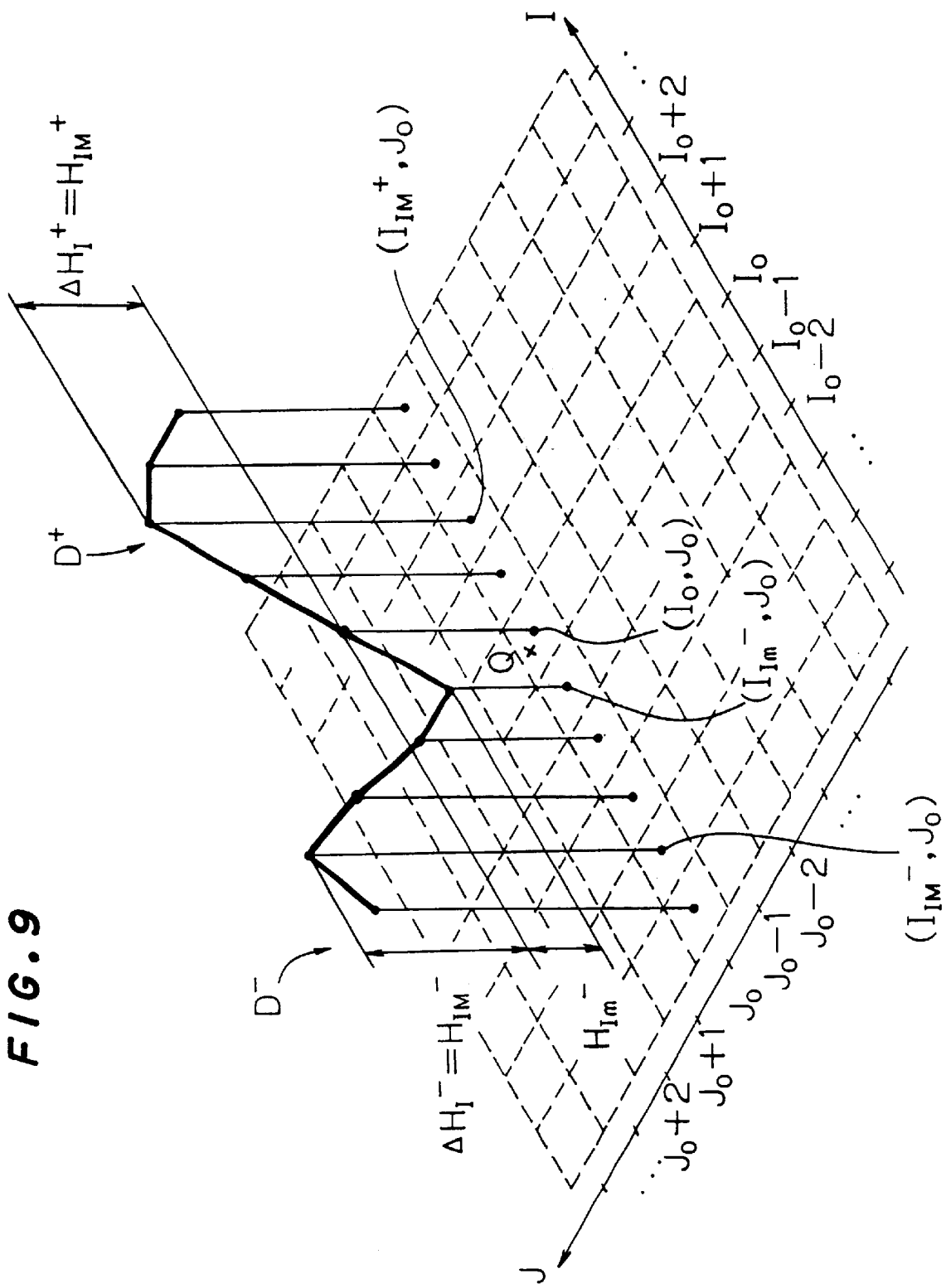
FIG. 9 is a concept diagram explaining the first preferred embodiment of the invention.

FIG. 9 is a concept diagram showing the mode of specifying the position $(I_0, J_0)$ on the plane IJ. If the position Q for actually forming the contact hole is not located at the center of the orthogonal mesh used in shape simulation, the center of the orthogonal mesh in which the position Q is present is regarded as the position $(I_0, J_0)$.

At step S300, undulations are judged in a region having a specific expanse nearly centered at position $(I_0, J_0)$. Herein, undulations are judged in 100 cells spreading by 10 blocks each in direction I and direction J. For example, when one orthogonal cell has a width of 0.5 $\mu$m in direction I and direction J, undulations are judged in a region of 5 $\mu$m square nearly centered at position $(I_0, J_0)$.

Back to FIG. 8, the explanation is continued by limiting to the case of judging undulations only in direction I. The region $I_0^+$ is an area including the position $(I_0, J_0)$, and belonging to the increasing direction of I (hereinafter called $I^+$ direction), with $J_0$ being invariable. That is, it may be expressed as follows:

$$I_0^+ = \{(I_0, J_0), (I_0+1, J_0), \ldots (I_0+N, J_0)\}$$

Similarly, the region $I_0^-$ is an area including the position $(I_0, J_0)$, and belonging to the decreasing direction of I (hereinafter called $I^-$ direction), with $J_0$ being invariable. That is, it may be expressed as follows:

$$I_0^- = \{(I_0, J_0), (I_0-1, J_0), \ldots (I_0-N, J_0)\}$$

At step S320, the regions $I_0^+$, $I_0^-$ are judged to be in the state $D^+$, $D^-$ or not. The judging method is described specifically in the next section, but roughly speaking, the state $D^+$ refers to the case in which $H(I, J_0)$ tends to increase in the $I^+$ direction, and the state $D^-$ refers to the case in which $H(I, J_0)$ tends to decrease in the $I^+$ direction. In FIG. 9, the region $I_0^-$ is in the state $D^-$, and the region $I_0^+$ is in the state $D^+$.

At step S330 to step S380, according to the result of step S320, it is judged whether the vicinity of H $(I_0, J_0)$ is concave or convex, that is, presence or absence of undulations at position $(I_0, J_0)$ is judged.

First, at step S330, both regions $I_0^+$ and $I_0^-$ are judged to be equally in state $D^+$, or equally in state $D^-$. When this condition is satisfied, concerning the $I^+$ direction, H $(I_0, J_0)$ is either in the monotonously increasing tendency (in the case of state $D^+$) or in the monotonously decreasing tendency (in the case of state $D^-$). Therefore, advancing to step S380, it is judged that undulations are absent at position $(I_0, J_0)$. In other directions (direction J, first direction, second direction), undulations are judged, thereby advancing to step S400.

If the condition is not satisfied at step S330, advancing to step S340, the regions $I_0^+$, $I_0^-$ are judged to be respectively in state $D^+$ and state $D^-$. When this condition is satisfied, concerning the $I^+$ direction, H $(I, J_0)$ is judged nearly to be concave (step S350), and undulations are also judged in other directions (direction J, first direction, second direction), thereby advancing to step S400.

If the condition is not satisfied at step S340, advancing to step S360, the regions $I_0^+$, $I_0^-$ are judged to be respectively in state $D^-$ and state $D^+$. When this condition is satisfied, concerning the $I^+$ direction, H $(I, J_0)$ is judged nearly to be convex (step S370), and undulations are also judged in other directions (direction J, first direction, second direction), thereby advancing to step S400.

The case in which the condition of step S360 is not satisfied is the case in which at least one of regions $I_0^+$ and $I_0^-$ is neither in state $D^+$ nor in state $D^-$, and in such state, undulations are judged to be absent (step S380).

(A-4) Detail of step S320

FIG. 10 is a flowchart showing the detail of step S320. Shown here is only an example of specifying the states $D^+$, $D^-$ in the region $I_0^-$. In the region $I_0^-$, similarly, the states $D^+$, $D^-$ are judged. Of course, when step S300 is executed in other direction, for example, direction J, at step S320, the states $D^+$, $D^-$ are judged in the regions $J_0^+$ (={$(I_0, J_0)$, $(I_0, J_0+1)$, ... $(I_0, J_0+N)$}), $J_0^-$(={$(I_0, J_0)$, $(I_0, J_0-1)$, ... $(I_0, J_0-N)$}).

First, at step S321, the position $(I_{IM}^+, J_0)$ taking the maximum value in region $I_0^+$, and the position $(I_{Im}^+, J_0)$ taking the minimum value are determined. In the example shown in FIG. 9, the maximum value is taken at position $(I_0+2, J_0)$, and the minimum value, at position $(I_0, J_0)$.

Next, at step S322, $H_{IM}^+$ is determined by subtracting the height H $(I_0, J_0)$ at position $(I_0, J_0)$ from the maximum value in the region $I_0^+$, and $H_{Im}^+$ is determined by subtracting the minimum value from the height H ($I_0$, $J_0$) at position ($I_0$, $J_0$). That is, on the basis of the height H ($I_0$, $J_0$) at position ($I_0$, $J_0$), the height $H_{IM}^+$ of the maximum value, and the depth $H_{Im}^+$ of the minimum value are determined.

Figure 11:
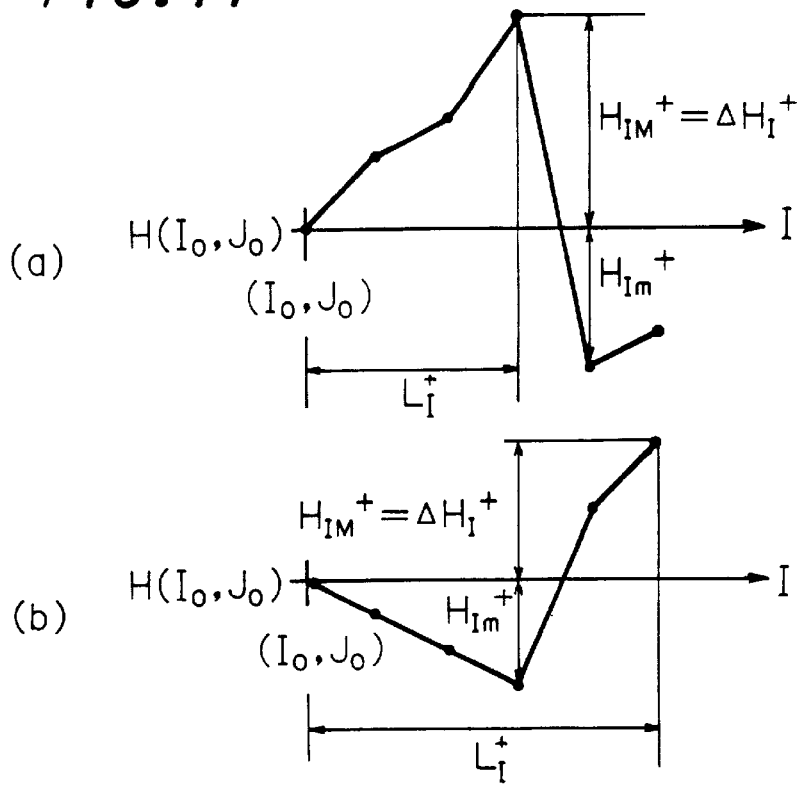
FIGS. 11 to 13 are graphs explaining the first preferred embodiment of the invention.
Figure 12:
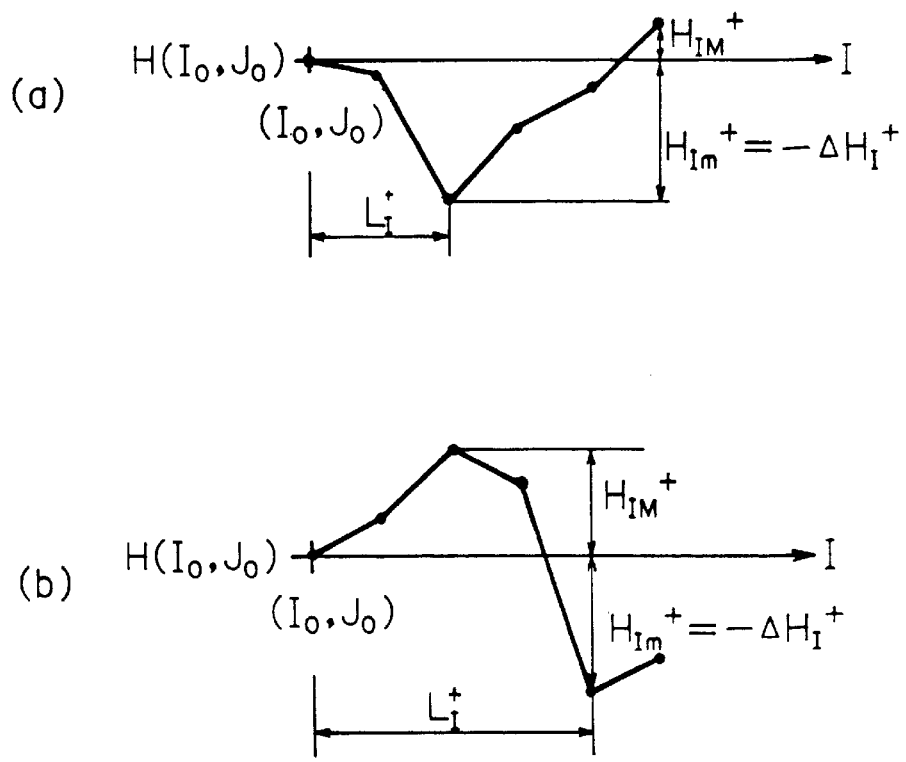
Figure 13:
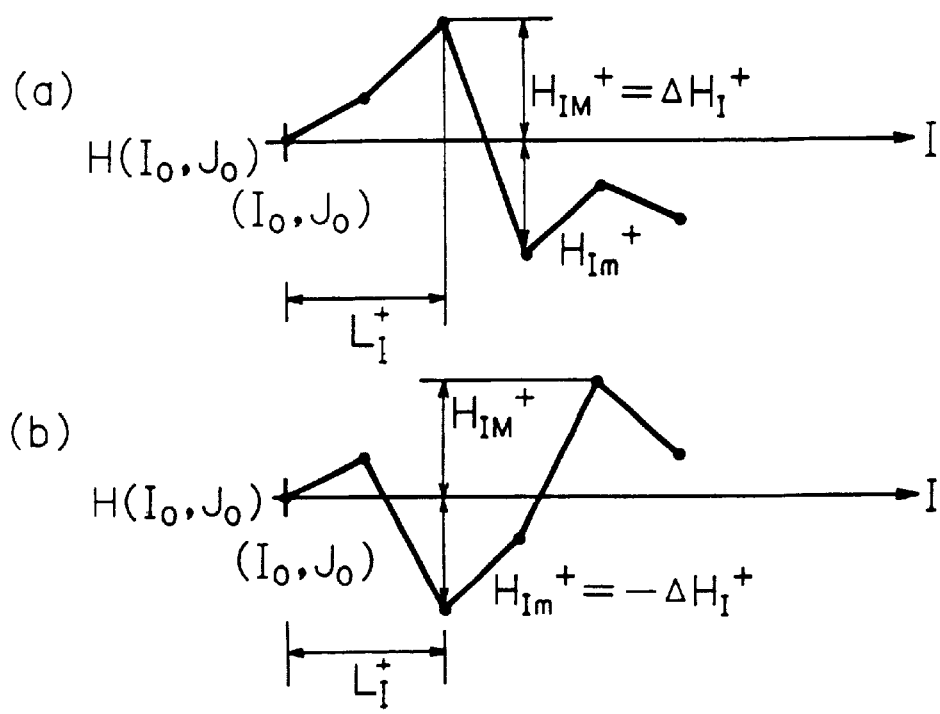

FIG. 11 to FIG. 13 are graphs for explaining the manner of determining $\Delta H_I^+$, $L_I^+$ at step S323. FIG. 11 refers to the case of $H_{IM}^+ > H_{Im}^+$, FIG. 12, the case of $H_{IM}^+ < H_{Im}^+$, and FIG. 13, the case of $H_{IM}^+ = H_{Im}^+$.

If $H_{IM}^+ > H_{Im}^+$, $\Delta H_I^+$ is taken equally to $H_{IM}^+$, and $L_I^+$ is determined as the absolute value of $I_0 - I_{IM}^+$. FIGS. 11(a) shows the case of $I_{IM}^+ < I_{Im}^+$, and (b) is the case of $I_{IM}^+ > I_{Im}^+$.

If $H_{IM}^+ < H_{Im}^+$, $\Delta H_I^+$ is taken equally to $-H_{Im}^+$, and $L_I^+$ is determined as the absolute value of $I_0 - I_{Im}^+$. FIGS. 12(a) shows the case of $I_{IM}^+ < I_{Im}^+$, and (b) is the case of $I_{IM}^+ > I_{Im}^+$.

If $H_{IM}^+ = H_{Im}^+$, $L_I^+$ is either the absolute value of $I_0 - I_{IM}^+$ or the absolute value of $I_0 - I_{IM}^+$, whichever the smaller. When $L_I^+$ is the absolute value of $I_0 - I_{IM}^+$, that is, when the distance from position ($I_0$, $J_0$) to position ($I_{Im}^+$, $J_0$) is longer than the distance from position ($I_0$, $J_0$) to position ($I_{IM}^+$, $J_0$), $\Delta H_I^+$ is taken equally to $H_{IM}^+$. When $L_I^+$ is the absolute value of $I_0 - I_{Im}^+$, that is, when the distance from position ($I_0$, $J_0$) to position ($I_{Im}^+$, $J_0$) is shorter than the distance from position ($I_0$, $J_0$) to position ($I_{IM}^+$, $J_0$), $\Delta H_I^+$ is taken equally to $-H_{Im}^+$. FIGS. 13(a) refers to the case of $I_{IM}^+ < I_{Im}^+$, and (b) is the case of $I_{IM}^+ > I_{Im}^+$.

Being thus determined, the sign of $\Delta H_I^+$ indicates increase or decrease along the $I^+$ direction in region $I_0^+$, and by dividing $\Delta H_I^+$ by $L_I^+$ (that is, by determining $\Delta H_I^+ / L_I^+$), a rough tendency of increase or decrease along in the $I^+$ direction in the region $I_0^+$ is shown. In other words, undulations smaller than $H_{IM}^+$, $H_{Im}^+$ are not taken into consideration. Therefore, the tendency of increase or decrease of thickness of the resist provided on the base is not influenced by a slight error of the base shape which may occur in shape simulation.

At step S324, the status in the region $I_0^+$ is judged by the sign of $\Delta H_I^+$. That is, when $\Delta H_I^+ > 0$, the region $I_0^+$ is judged to be in state $D^+$, and when $\Delta H_I^+ < 0$, the region $I_0^+$ to be in state $D^-$.

Figure 14:
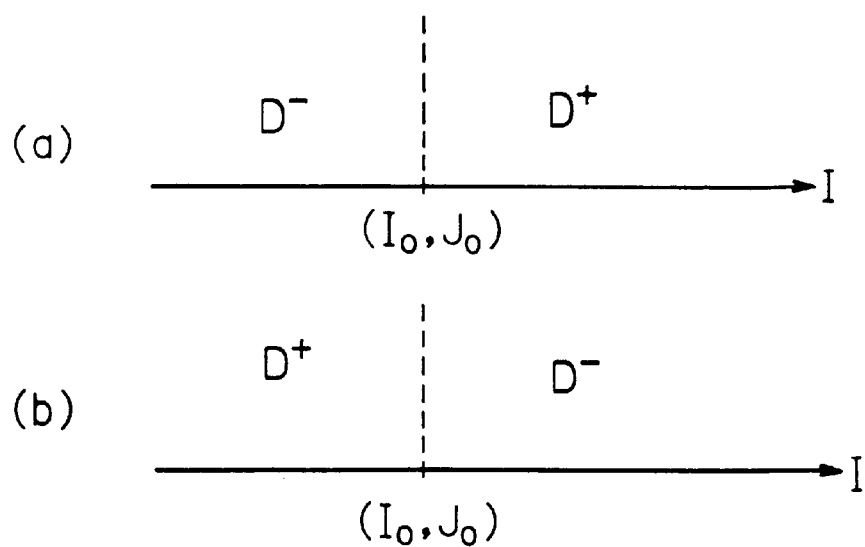
FIG. 14 is a concept diagram explaining the first preferred embodiment of the invention.

FIG. 14 is a concept diagram showing the mode of judging presence or absence of undulations, which corresponds to steps S330 to S380. For example, as shown in FIG. 14(a), when the state in the region $I_0^+$ is $D^+$ and the state in the region $I_0^-$ is $D^-$, it is judged that a concave portion is present at position ($I_0$, $J_0$). As shown in FIG. 14(b), when the state in the region $I_0^+$ is $D^-$ and the state in the region $I_0^-$ is $D^+$, it is judged that a convex portion is present at position ($I_0$, $J_0$).

Of course, when all heights in the region $I_0^+$ are equal to the height H ($I_0$, $J_0$), it results in $\Delta H_I^+ = 0$, which corresponds neither to the state $D^+$ nor to $D^-$. This is the case when the condition at step S360 is not satisfied.

(A-5) Detail of step S500

Figure 15:
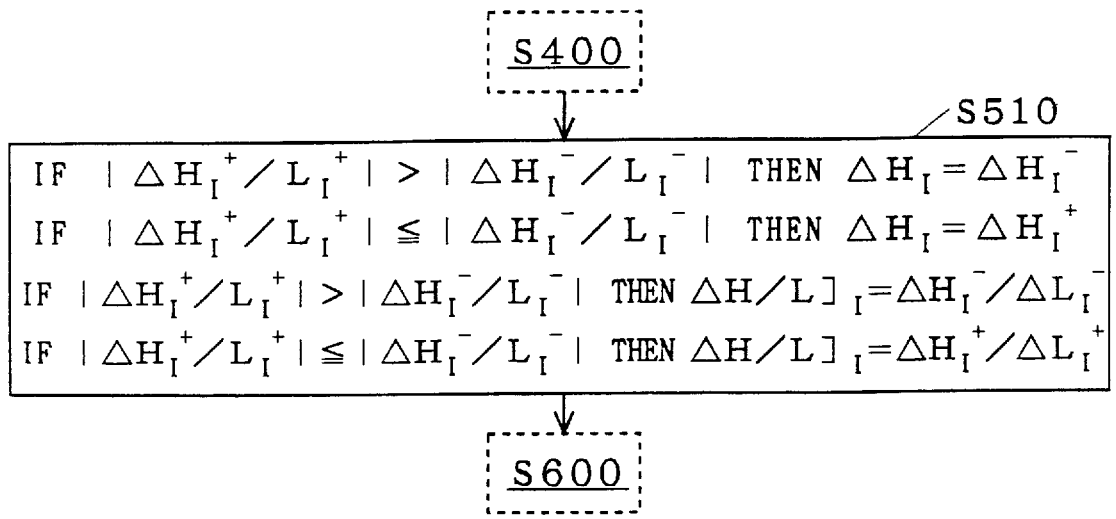
FIGS. 15 and 16 are flowcharts explaining the first preferred embodiment of the invention.

FIG. 15 is a flowchart showing the detail of step S500. It only shows an example of determining the altitude amount candidate and slope amount candidate concerning direction I. In other direction J, first and second directions, the altitude amount candidate and slope amount candidate are determined similarly.

At step S510, it is determined whether the slope in the region $I_0^+$ or the slope in the region $I_0^-$ for forming undulations contributes more to determination of the resist film thickness at position ($I_0$, $J_0$). It is supposed herein that the milder slope determines the resist film thickness more dominantly.

When the absolute value of the slope $\Delta H_I^+ / L_I^-$ in the region $I_0^+$ is greater than the absolute value of the slope $\Delta H_I^- / L_I^-$ in the region $I_0^-$, $\Delta H_I^-$ is taken as the altitude amount candidate $\Delta H_I$. On the other hand, when the absolute value of the slope $\Delta H_I^+ / L_I^+$ in the region $I_0^+$ is smaller than the absolute value of the slope $\Delta H_I^- / L_I^-$ in the region $I_0^-$, $\Delta H_I^+$ is taken as the altitude amount candidate $\Delta H_I$.

Similarly, when the absolute value of the slope $\Delta H_I^+ / L_I^+$ in the region $I_0^+$ is greater than the absolute value of the slope $\Delta H_I^- / L_I^-$ in the region $I_0^-$, $\Delta H/L]_I$ is $\Delta H_I^- / L_I^-$. On the other hand, when the absolute value of the slope $\Delta H_I^+ / L_I^+$ in the region $I_0^+$ is smaller than the absolute value of the slope $\Delta H_I^- / L_I^-$ in the region $I_0^-$, $\Delta H/L]_I$ is $\Delta H_I^+ / L_I^+$.

Of course, the steeper slope may determine the resist film thickness more dominantly, depending on other conditions than the shape of the base, such as the kind of the base, kind of the resist, and mutual relation of the base and resist, or an intermediate value of $\Delta H_I^+ / L_I^+$ and $\Delta H_I^- / L_I^-$, or an intermediate value of $\Delta H_I^+$ and $\Delta H_I^-$ (for example, average) may be also used.

At step S500, in the direction in which presence of undulations is confirmed among direction I, direction J, first and second directions, the altitude amount candidate $\Delta Hp$, and slope amount candidate $\Delta H/L]_p$ (p=I, J, 1, 2) are determined.

(A-6) Detail of step S600

Figure 16:
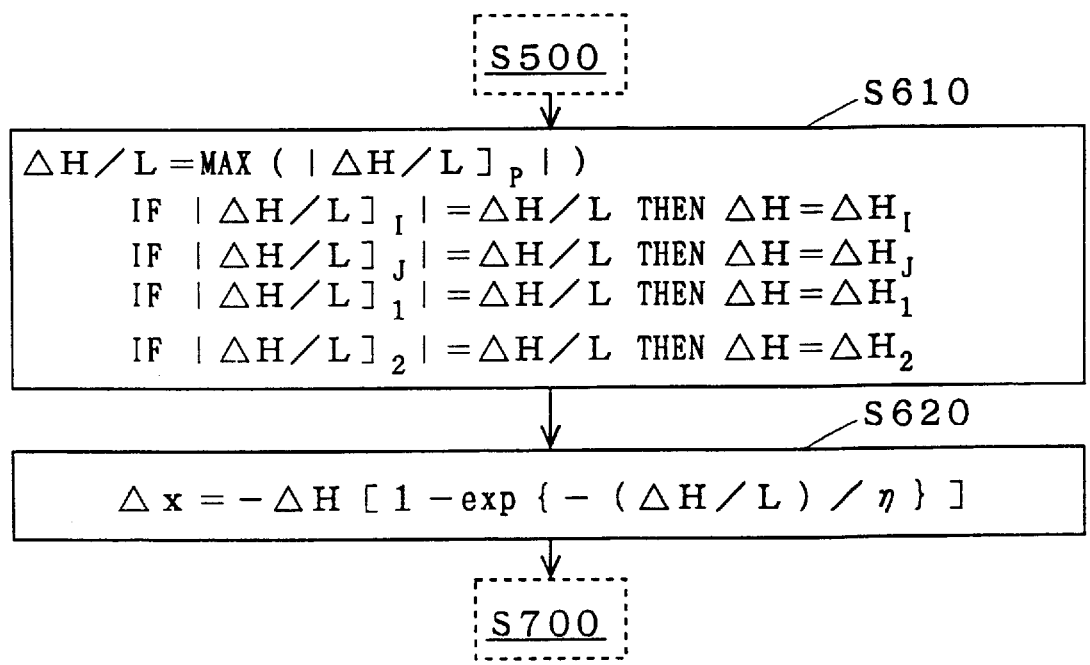

FIG. 16 is a flowchart showing the detail of step S600. First, at step S610, the maximum absolute value among $\Delta H/L]_I$, $\Delta H/L]_J$, $\Delta H/L]_1$, and $\Delta H/L]_2$, is determined as the slope amount $\Delta H/L$. The symbol MAX ( ) means the maximum with the parentheses. When the slope $\Delta H/L$ is, for example, the slope amount candidate $\Delta H/L]_I$, the altitude amount candidate $\Delta H_I$ is taken as the altitude amount $\Delta H$.

Next, at step S620, the film thickness increment or decrement $\Delta x$ is determined. Herein, supposing $$\Delta x = -\Delta H \{1 - \exp\{-(\Delta H/L)/\eta\}\} \quad (1)$$

the film thickness increment or decrement $\Delta x$ is determined. In formula (1), relaxation factor $\eta$ ($0 < \eta$) is introduced. At the right side, $(-\Delta H)$ is multiplied, and the film thickness increment or decrement $\Delta x$ is determined as a positive number if a concave portion is present, or the film thickness increment or decrement $\Delta x$ is determined as a negative number if a convex portion is present.

Figure 17:
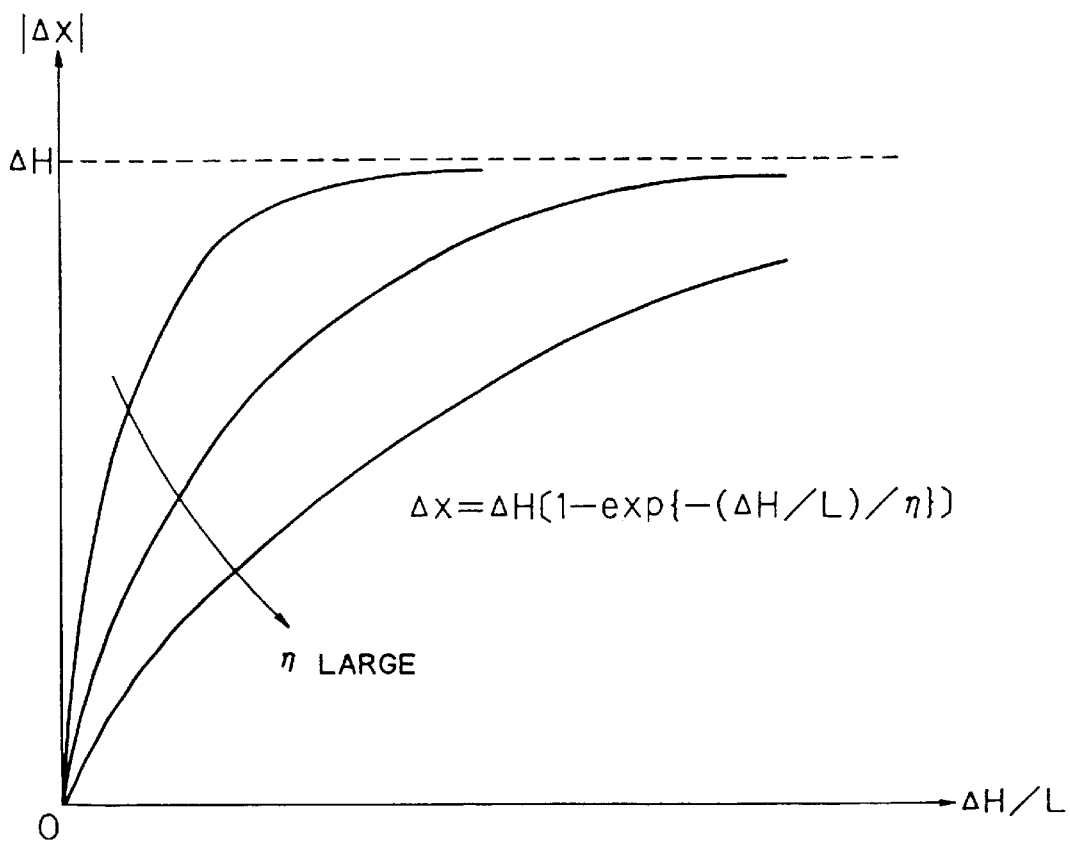
FIG. 17 is a graph schematically showing the first preferred embodiment of the invention.

FIG. 17 is a graph showing schematically the relation between the absolute value of the film thickness increment or decrement $\Delta x$ and the slope amount $\Delta H/L$. The greater the slope amount $\Delta H/L$, that is, the more manifest the degree of undulations, the greater becomes the absolute value of the film thickness increment or decrement $\Delta x$. That is, at the resist film thickness, the deviation of x to $x_0$ is large. But the degree of deviation is alleviated as the relaxation factor $\eta$ is greater. Therefore, by employing formula (1), the effect of other factors than the base shape, such as the characteristic of the resist and mutual relation of the base and resist, can be considered by the relaxation factor $\eta$. For example, the relaxation factor $\eta$ is set below about 0.5.

Figure 18:
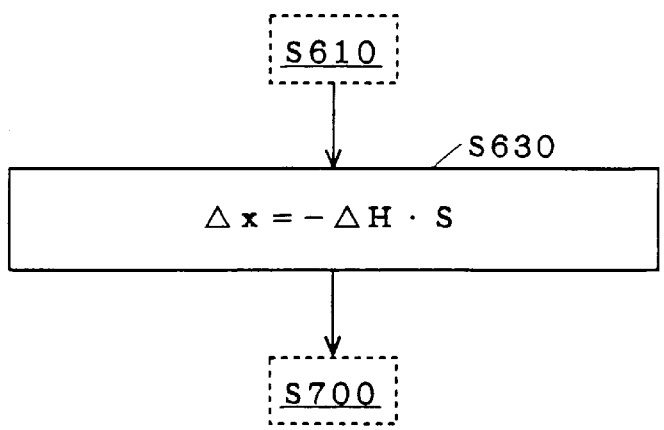
FIG. 18 is a flowchart explaining the first preferred embodiment of the invention.

FIG. 18 is a flowchart showing step S630 which can be replaced with step S620. At step S630, the film thickness increment or decrement $\Delta x$ is evaluated more easily than at step S620. Herein, supposing $$\Delta x = -\Delta H \cdot S \quad (2)$$

the film thickness increment or decrement $\Delta x$ is determined. In formula (2), relaxation factor S ($0 < S$) is introduced, and it is evaluated only by the altitude amount $\Delta H$ and relaxation factor S. Same as in formula (1), at the right side, $(-\Delta H)$ is multiplied, and the film thickness increment or decrement $\Delta x$ is determined as a positive number if a concave portion is present, or the film thickness increment or decrement $\Delta x$ is determined as a negative number if a convex portion is present. The relaxation factor S is set at, for example, about 0.2.

(A-7) Detail of step S700

Figure 19:
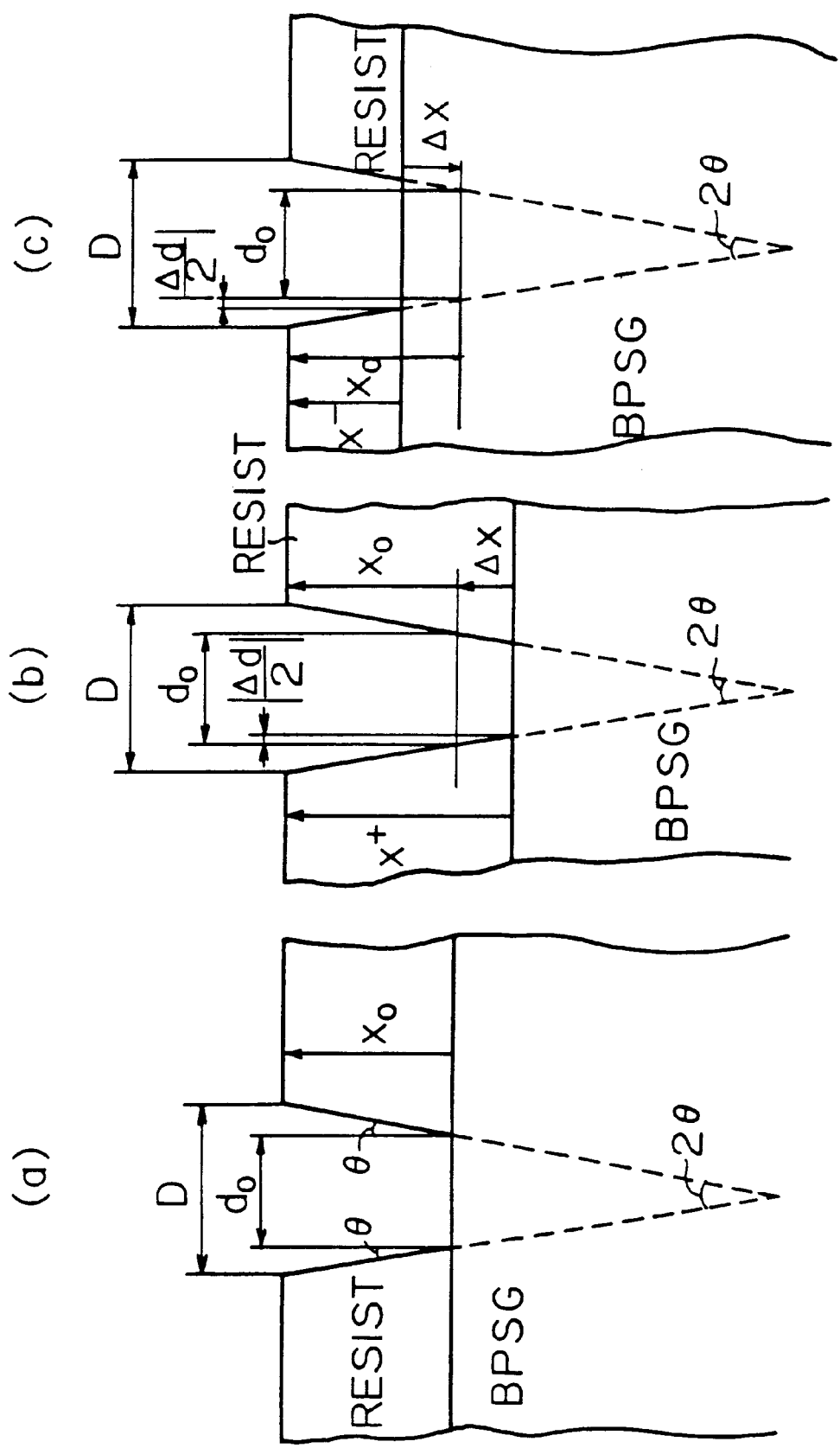
FIG. 19 is a sectional view explaining the first preferred embodiment of the invention.

FIG. 19 is a sectional view explaining a method of determining the diameter increment or decrement $\Delta d$ from the film thickness increment or decrement. In FIG. 19(a), the resist is formed on a flat area, and its film thickness is $x_0$, in (b), the resist is formed in a concave portion, and its film thickness is $x^+$ ($>x_0$), and in (c) the resists is formed on a convex portion, and its film thickness is $x^-$ ($<x_0$).

In FIG. 19(a), the relation between the actual size D of the mask actually fabricated as mask pattern and the contact hole diameter $d_0$ is expressed as follows in terms of parameter $\theta$:

$$\tan \theta = (D-d_0)/2x_0 \quad (3)$$

here the parameter $\theta$ is an intrinsic value for the resist determined by the characteristic of the resist, for example, the transmissivity of the irradiated light.

Hence, in FIGS. 19(b) and (c), introducing the parameter $\theta$ also introduced in formula (3), the formula (4)

$$\tan \theta = \{D-(d_0+\Delta d)\}/2(x_0+\Delta x) \quad (4)$$

is established. In FIG. 19, the upward direction is positive, and downward direction is negative. In FIG. 19(b), the film thickness increment or decrement $\Delta x$ is positive, and the diameter increment or decrement $\Delta d$ at this time is negative. In FIG. 19(c), the film thickness increment or decrement $\Delta x$ is negative, and the diameter increment or decrement $\Delta d$ at this time is positive.

From formulas (3) and (4), the diameter increment or decrement $\Delta d$ is determined as follows.

$$\Delta d = -2\Delta x \cdot \tan \theta \quad (5)$$

Figure 20:
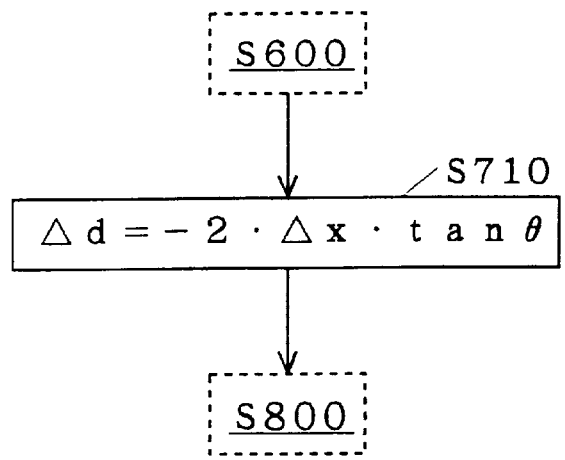
FIGS. 20 and 21 are flowcharts explaining the first preferred embodiment of the invention.

FIG. 20 is a flowchart showing the detail of step S700, and the process according to formula (5) is executed at step S710.

Of course, instead of step S710, other process may be done for determining the diameter increment or decrement $\Delta d$ on the basis of the film thickness increment or decrement $\Delta x$.

(A-8) Modified example of first preferred embodiment

Various modifications are possible in the first preferred embodiment. Instead of analyzing in all of direction I, direction J, first and second directions, only the pair of mutually orthogonal direction I and direction J, or the pair of first and second directions may be analyzed.

Or, for example, the contact hole diameter may be predicted by two-dimensional analysis for considering the base shape only in the direction I and height. In this case, the shape simulation at step S3 is done two-dimensionally, and the height of the object A at step S100 may be expressed as the function H(I) of I only. The position for forming a contact hole at step S300 is specified as ($1_0$), and at step S300, therefore, presence or absence of undulations is inspected only in direction I.

Therefore, at step S400, presence or absence of undulations is investigated in direction I, and at step S500, therefore, only the altitude amount candidate $\Delta H_I$ and slope amount candidate $\Delta H/L]_I$ are determined. At step S610, the altitude amount candidate $\Delta H_I$ is taken as the altitude amount $\Delta H$, and the slope amount candidate $\Delta H/L]_I$ is taken as the slope amount $\Delta H/L$.

When step S4 is promoted only by two-dimensional analysis in this way, if the film thickness increment or decrement $\Delta x$ is determined further by using formula (2), it is not necessary to determine the slope amount $\Delta H/L$ nor slope amount candidate $\Delta H/L]_I$. The reason is as follows.

Figure 21:
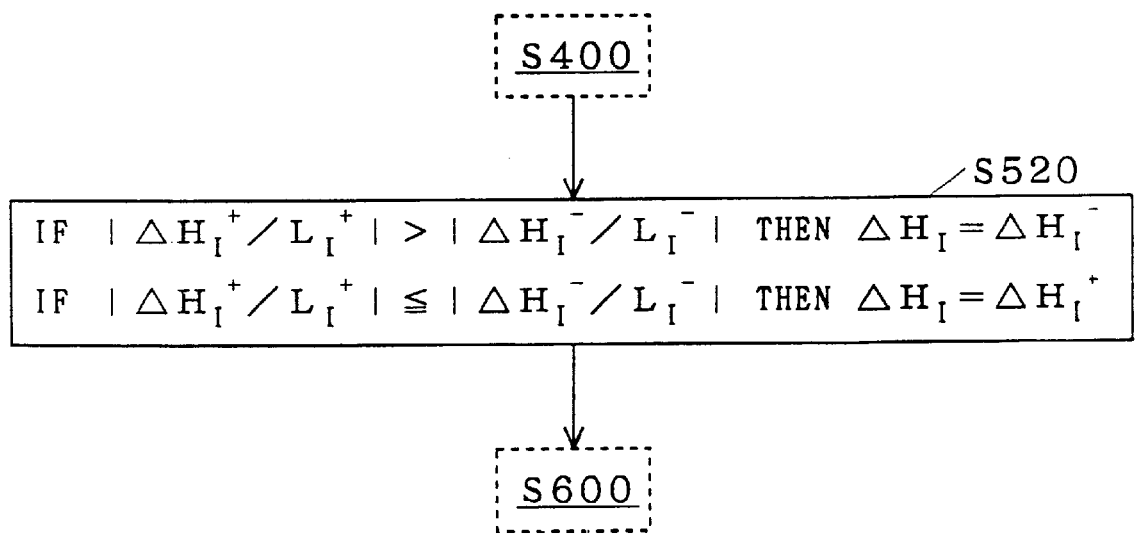

At step S630, the slope amount $\Delta H/L$ is not employed, and it is not necessary at step S610 to compare the slope amount candidates $\Delta H/L]_p$ for determining the altitude amount $\Delta H$. Therefore, at step S500, it is not necessary to determine the slope amount candidate $\Delta H/L]_I$. FIG. 21 is a flowchart showing the step S520 for composing step S500 in such a case.

It is thus advantageous that the required process is less when analyzing two-dimensionally.

On the other hand, by performing two-dimensional analysis in direction I and direction J, the diameter increment or decrement $\Delta d_I$ in direction I, and the diameter increment or decrement $\Delta d_J$ in direction J can be determined individually. Such method of determining is preferable especially when the contact hole is rectangular, having sides parallel to direction I and sides parallel to direction J.

B. Second Preferred Embodiment

In the first preferred embodiment, at step S600, employing the relaxation factors $\eta$ and S, the film thickness increment or decrement $\Delta x$ was determined. However, by the resist coating shape simulation, the resist film thickness can be determined, and accordingly the film thickness increment or decrement $\Delta x$ can be determined.

Such resist application shape simulation is known, and is disclosed, for example, in "Spin Coating Over Topography," L. M. Peurrung and D. B. Graves, IEEE transactions on semiconductor manufacturing, Vol. 6, No. 1, pp. 72–76 (1993).

By thus using the resist coating shape simulation, the film thickness increment or decrement $\Delta x$ is determined in consideration of the resist viscosity, and therefore the diameter increment or decrement $\Delta d$ of higher precision for actual deviation of the contact hole diameter can be obtained.

C. Third Preferred Embodiment

In the first preferred embodiment, at step S700, the diameter increment or decrement $\Delta d$ was determined by using parameter $\theta$ showing the resist characteristic. After determining the film thickness increment or decrement (or film thickness $x=x_0+\Delta x$) by the technique disclosed in the first preferred embodiment or second preferred embodiment, the light intensity distribution simulation may be done on the resist, and the contact hole diameter may be estimated from the surface (equal intensity surface) having a specific light intensity. Such technique is also useful because the resist is changed in the dissolution characteristic in the developing solution depending on the light exceeding the specific intensity and the shape of the resist developed and left over is determined.

For example, when the light intensity distribution is expressed by percentage, the resist receiving the light intensity of more than 15 percent is supposed to be dissolved by development, and the equal intensity surface of 15 percent is determined and the boundary contacting with it on the base may be determined as the shape of the contact hole.

Such light intensity distribution simulation is known, and is disclosed, for example, in "Partially Coherent Imaging In Two Dimensions and the Theoretical Limits of Projection Printing in Microfabrication," B. J. Lin, IEEE transactions on electron devices, Vol. ED-27, No. 5, pp. 931–938 (1980), or "Modeling Aerial Images in Two and Three Dimensions," M. Yeung, Proc. of Kodak ME Seminar Interface 85, pp. 115–126 (1986). In particular, the calculation technique of light intensity distribution inside the resist is disclosed in "Modeling Latent Image Formation in Photolithography Using the Helmholtz Equation," H. P. Urbach and D. A. Bernald, SPIE Vol. 1264, Optical/Laser Microlithography III, pp. 278–293 (1990).

Figure 22:
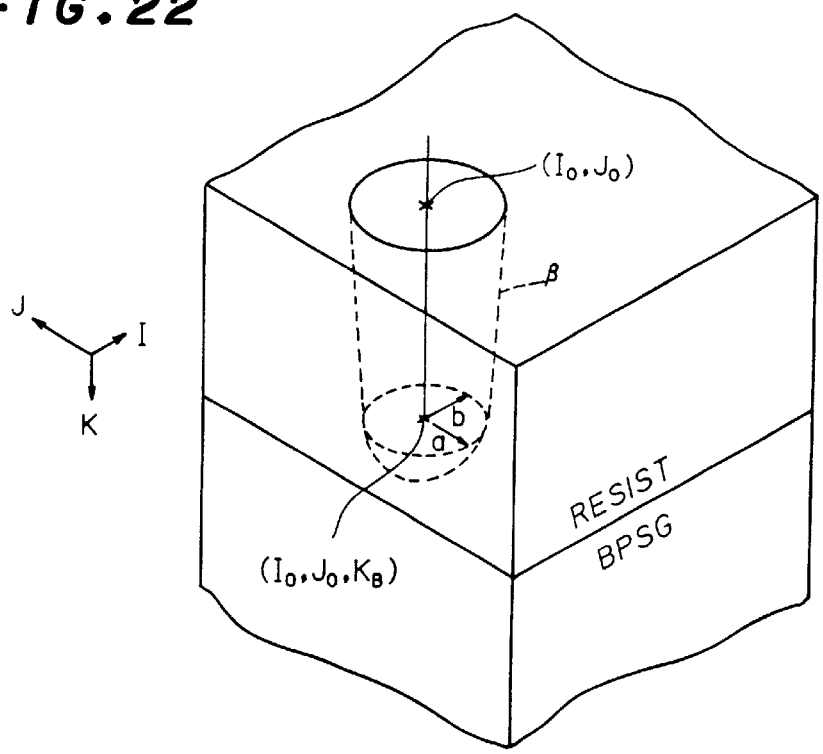
FIG. 22 is a schematic diagram explaining a third preferred embodiment of the invention.

FIG. 22 is a schematic diagram for explaining a practical technique for determining the shape of contact hole from various equal intensity surfaces obtained by the light intensity distribution simulation. At the position ($I_0$, $J_0$, KB ($I_0$, $J_0$)) at the boundary of the resist and the base of BPSG film immediately beneath the contact hole position ($I_0$, $J_0$), the light intensity is investigated to be if more than the specified intensity (for example, 15 percent) or not. Herein, KB ($I_0$, $J_0$) refers to the position of the boundary of the base and BPSG film, which may be represented by the height H ($I_0$, $J_0$) in the first preferred embodiment.

For example, if the equal intensity surface $\beta$ indicated in FIG. 22 is an equal intensity surface more than the specified intensity, it is natural that the light is emitted from above the resist, and therefore the light intensity is considered to be more than the specified intensity above the equal intensity surface $\beta$, and hence the light intensity at position ($I_0$, $J_0$, KB) is judged to be more than the specified intensity (for example, 15 percent).

Next, from the position ($I_0$, $J_0$, KB) along the boundary of the resist and base, an equal intensity surface of specified intensity is searched in direction I and direction J, and the distance b in direction I and distance a in direction J from the position ($I_0$, $J_0$, KB) to the specified equal intensity surface are determined. The distances a and b thus determined represent the contact hole diameter.

If the light intensity at position ($I_0$, $J_0$, KB ($I_0$, $J_0$)) is less than the specified intensity, if the resist is developed, the bottom of the contact hole does not reach up to the boundary surface of the resist and the base, and hence the contact hole diameter is judged to be 0.

D. Fourth Preferred Embodiment

In the third preferred embodiment, only the equal intensity surface for determining the dissolution characteristic of the resist is obtained, but it is also possible to obtain the shape of the resist left over after development by simulating the development process. Such simulation of development process is known, and is disclosed, for example, by the present applicant in Japanese Patent Laid-open Gazette No. 4-133326 and U.S. Pat. No. 5,293,557.

Figure 23:
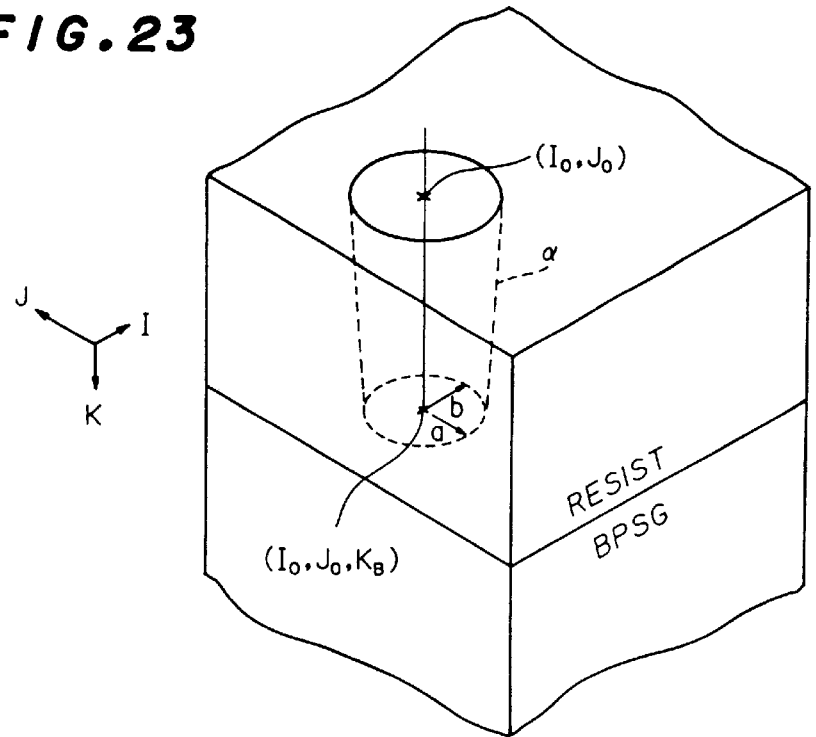
FIG. 23 is a schematic diagram explaining a fourth preferred embodiment of the invention.
Figure 24:
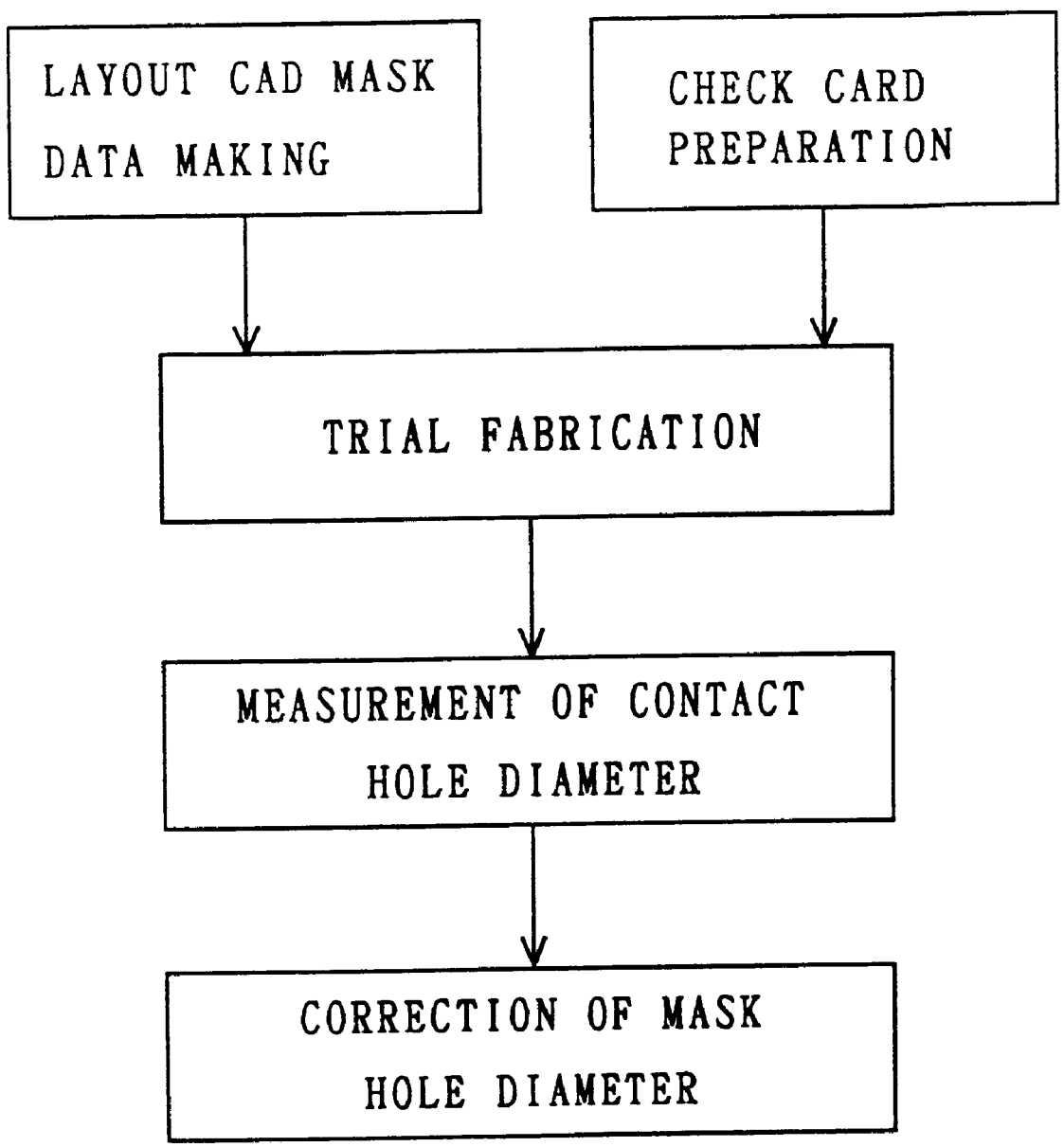
FIG. 24 is a flowchart showing a background art.

FIG. 23 is a schematic diagram explaining a practical method of determining the shape of contact hole from various equal intensity surfaces obtained by light intensity distribution simulation. The position ($I_0$, $J_0$, KB ($I_0$, $J_0$)) is same as in the third preferred embodiment. The shape of the resist left over after development is indicated by surface $\alpha$.

If there is a base (BPSG) at position ($I_0$, $J_0$, KB), the surface a is searched from the position ($I_0$, $J_0$, KB) in direction I and direction J along the boundary of the resist and base, and distance b in direction I and distance a in direction J from the position ($I_0$, $J_0$, KB) to surface $\alpha$ are determined. Thus obtained distances a and b represent the contact hole diameter.

If a resist is present at position ($I_0$, $J_0$, KB), as a result of development of the resist, the bottom of the contact hole does not reach up to the boundary of the resist and base, and hence the contact hole diameter is judged to be 0.

E. Fifth Preferred Embodiment

An upper limit $\Delta d_{max}$ may be provided in the absolute value of the diameter increment or decrement $\Delta d$ determined at step S700. When the absolute value of the diameter increment or decrement $\Delta d$ exceeds the upper limit $\Delta d_{max}$, the contact hole to be formed at position ($I_0$, $J_0$) may be judged to be defective.

At step S5, on the layout editor screen for designing the mask pattern M', the caution may be alerted by flickering, or displaying in a specific appealing color, such as white, yellow, sky blue and yellowish green. Thus, the mask pattern can be corrected by easy operation.

MODIFIED EXAMPLE

The invention may be applied not only in control of the contact hole diameter of semiconductor device, but also in fine processing in forming impurity region such ion implantation. Evidently, it may be also applied in fine processing of micromachine.

While the invention has been shown and described in detail, the foregoing description is in all aspects illustrative and not restrictive. It is therefore understood that numerous modifications and variations can be devised without departing from the scope of the invention.

What is claimed is:

1. A method of making a mask pattern involving the correcting of a mask pattern used for providing an actual pattern in a processing region of an object, comprising the steps of:
    (a) making said mask pattern;
    (b) judging undulation of a surface of said object wherein a surface shape of said object surface is recognized as a surface height, relative to a foundation region expanding at least in a first direction and in a second direction opposite to said first direction wherein said judging undulation includes the steps of:
        (b-1) determining said surface height by simulation;
        (b-2) specifying the position of said processing region in said foundation region;
        (b-3) setting a first region expanding in said first direction from said processing region, and a second region expanding in said second direction from said processing region;
        (b-4) detecting whether a first state of said surface height tending to increase relative to said first direction or a second state tending to decrease relative to said first direction is present, in both said first and second regions, on the basis of the result of said step (b-1); and
        (b-5) judging undulation about said first and second directions in said processing region on the basis of the result of said step (b-4);
    (c) predicting dimensions of said actual pattern depending on the degree of said undulations; and
    (d) correcting by giving a correction amount to the dimensions of said mask pattern, depending on the result of said step (c);
wherein said actual pattern is provided by forming a resist on the object, and shaping said resist depending on said mask pattern and wherein said object surface is an oxide film.

2. The method of making a mask pattern of claim 1, wherein said step (c) includes steps of:
    (c-1) determining a film thickness variation of said resist in said processing region, on the basis of the resist thickness when said object surface is flat; and (c-2) predicting, on the basis of said film thickness variation, that a first direction of deviation of the dimensions of said actual pattern when said processing region is concave as compared with said actual pattern when said processing region is flat, and a second direction of deviation of the dimensions of said actual pattern when said processing region is convex as compared with said actual pattern when said processing region is flat are reverse to each other, and that the dimensions of said actual pattern are deviated larger when the degree of undulations of said processing region is greater as compared with when said processing region is flat.

3. The method of making a mask pattern of claim 2, wherein said step (b-4), respectively in said first and second regions, has steps of:

(b-4-1) determining a position for obtaining the maximum value of said surface height;

(b-4-2) determining a position for obtaining the minimum value of said surface height;

(b-4-3) determining a shape height by subtracting said surface height of said processing region from said maximum value;

(b-4-4) determining a shape depth by subtracting said minimum value from said surface height of said processing region;

(b-4-5) judging a presence of said first state when said shape height is greater than said shape depth; and (b-4-6) judging a presence of said second state when said shape height is smaller than said shape depth.

4. The method of making a mask pattern of claim 3, wherein said step (b-4-5) comprises, when said shape height is greater than said shape depth, a step of (b-4-5-1) taking said shape height as a first value, said step (b-4-6) comprises, when said shape height is smaller than said shape depth, a step of (b-4-6-1) taking the value multiplying said shape depth by (−1) as said first value, said step (c-1) has steps of:

(c-1-1) obtaining an altitude amount at an intermediate value of said first value of said first region and said first value of said second region; and (c-1-2) determining said film thickness variation on the basis of said altitude amount, and the absolute value of said film thickness variation is greater when the absolute value of said altitude amount is greater, and the sign of said altitude amount and the sign of said film thickness variation are different from each other, in said step (c-1-2).

5. The method of making a mask pattern of claim 4, wherein said step (c-1-1) comprises a step of (c-1-1-1) obtaining an slope amount at an intermediate value of the value of dividing said first value in said first region by said second value in said first region, and the value of dividing said first value in said second region by said second value in said second region, and said film thickness variation is determined also on the basis of said slope amount in said step (c-1-2), and the absolute value of said film thickness variation is greater when the absolute value of said slope amount is greater.

6. The method of making a mask pattern of claims 3, wherein said step (b-4-5 comprises, when said shape height is greater than said shape depth, steps of:

(b-4-5-1) taking said shape height as a first value; and (b-4-5-2) taking the distance along said first direction between said processing region and the position obtained in said step (b-4-1) as a second value, said step (b-4-6) comprises, when said shape height is smaller than said shape depth, steps of:

(b-4-6-1) taking the value multiplying said shape depth by (−1) as said first value; and (b-4-6-2) taking the distance along said first direction between said processing region and the position determined in said step (b-4-2) as said second value, said step (c-1) has steps of:

(c-1-1) obtaining an altitude amount at either said first value in said first region or said first value in said second region, on the basis of the magnitude relation between a third value obtained by dividing said first value in said first region by said second value in said first region, and a fourth value obtained by dividing said first value in said second region by said second value in said second region, and (c-1-2) determining said film thickness variation on the basis of said altitude amount, and the absolute value of said film thickness variation is greater when the absolute value of said altitude amount is greater in said step (c-1-2), and the sign of said altitude amount and the sign of said film thickness increment or decrement are different from each other.

7. The method of making a mask pattern of claim 6, wherein said step (c-1-1) comprises a step of (-1-1-1) taking either said third value or said fourth value as the slope amount, on the basis of the magnitude relation of said third value and said fourth value, and said film thickness variation is determined also on the basis of said slope amount in said step (c-1-2), and the absolute value of said film thickness increment or decrement is greater when the absolute value of said slope amount is greater.

8. The method of making a mask pattern of claim 2, wherein said step (c-2) includes a step of (c-2-1) determining a pattern variation deviated when compared with said actual pattern in the case that the dimension of said actual pattern is flat in said processing region, on the basis of said film thickness variation and an index shown a characteristic to an irradiation ray for exposing said resist.

9. The method of making a mask pattern of claim 2, wherein said foundation range further expands in a third direction orthogonal to said first and second directions, and a fourth direction opposite to said third direction, a third region expanding from said processing region in said third direction, and a fourth region expanding from said processing region in said fourth region are further set in said step (b-3), presence or absence of said first state and said second state with respect to said third direction is further detected in sad third and fourth regions in said step (b-4), undulations about said third and fourth directions in said processing region are further judged in said step (b-5), and the dimension of said actual pattern about said third and fourth directions is also predicted, together with the dimension of said actual pattern about said first and second directions in said step (c-1).

10. The method of making a mask pattern of claim 9, wherein said step (c-1) includes (c-1-1) a resist application simulation step for simulating the mode of said resist being disposed on said object.

11. A The method of making a mask pattern of claim 1, wherein said step (c-2) has steps of:
   (c-2-1) determining an equal strength plane by performing strength distribution simulation on irradiation ray for exposing said resist; and
   (c-2-2) estimating the shape of said resist when said resist is developed, from said equal strength plane.

12. The method of making a mask pattern of claim 1, wherein said actual pattern is provided by forming said resist on said object, and shaping said resist according to said mask pattern by exposure and development, and
   said step (c) includes a step of simulating said shaping.

13. A method of making a mask pattern involving the correction of a mask pattern used for providing an actual pattern in a processing region of an object comprising the steps of:
   (a) making said mask pattern;
   (b) judging undulation of a surface of said object;
   (c) predicting dimensions of said actual pattern depending on the degree of said undulation; and
   (d) correcting by giving a correction amount to the dimensions of said mask pattern, depending on the result of said step (c), wherein the surface shape of said object is understood as a surface height to a foundation region expanding in direction I and direction J orthogonal thereto, and
   said step (b) includes steps of:
      (b-1) determining said surface height by simulation;
      (b-2) specifying the position of said processing region in said foundation region;
      (b-3) setting a first region expanding in a positive direction from said processing region, and a second region expanding in a negative direction from said processing region, with respect to said direction I and direction J, respectively,
      (b-4) detecting whether said surface height is in a first state in increasing tendency or in a second state in decreasing tendency, about said positive direction, in said first and second regions, with respect to said direction I and direction J, respectively, on the basis of the result of said step (b-1), and
      (b-5) judging undulations about said direction I and direction J of said processing region on the basis of the result of said step (b-4).

14. The method of making a mask pattern of any one of claims 1 or 13, wherein said mask pattern is edited on a screen in said step (d), and
   a caution is visually alerted on said screen at a position where the absolute value of said correction amount exceeds a specific upper limit.

15. The method of making a mask pattern of claim 13, wherein said step (b-4) has, respectively in said first and second regions, steps of:
   (b-4-1) determining a position for obtaining the maximum value of said surface height;
   (b-4-2) determining a position for obtaining the minimum value of said surface height;
   (b-4-3) determining a shape height by subtracting said surface height of said processing region from said maximum value;
   (b-4-4) determining a shape depth by subtracting said minimum value from said surface height of said processing region;
   (b-4-5) judging the presence of said first state when said shape height is greater than said shape depth; and
   (b-4-6) judging the presence of said second state when said shape height is smaller than said shape depth.

16. The method of making a mask pattern of claim 15, wherein said step (b-4-5) comprises, when said shape height is greater than said shape depth, steps of:
   (b-4-5-1) taking said shape height as a first value; and
   (b-4-5-2) taking the distance along said first direction between said processing region and the position obtained in said step (b-4-1) as a second value,
   said step (b-4-6) comprises, when said shape height is smaller than said shape depth, steps of:
   (b-4-6-1) taking the value multiplying said shape depth by (−1) as said first value; and
   (b-4-6-2) taking the distance along said first direction between said processing region and the position determined in said step (b-4-2) as said second value,
   said step (c) includes steps of:
   (c-1) determining a film thickness variation of said resist in said processing region, on the basis of the resist thickness when said object surface is flat; and
   (c-2) predicting, on the basis of said film thickness variation, that a first direction of deviation of the dimensions of said actual pattern when said processing region is concave as compared with said actual pattern when said processing region is flat, and a second direction of deviation of the dimensions of said actual pattern when said processing region is convex as compared with said actual pattern when said processing region is flat are reverse to each other, and that the dimensions of said actual pattern are deviated larger when the degree of undulations of said processing region is greater as compared with when said processing region is flat;
   said step (c-1) comprises steps of:
      (c-1-1) obtaining, respectively about said direction I and direction J, an altitude amount candidate at either said first value in said first region or said first value in said second region, on the basis of the magnitude relation between a third value obtained by dividing said first value in said first region by said second value in said first region, and a fourth value obtained by dividing said first value in said second region by said second value in said second region;
      (c-1-2) taking, respectively about said direction I and direction J, either said third value or said fourth value as a slope amount candidate, on the basis of the magnitude relation between said third value and said fourth value;
      (c-1-3) taking said altitude amount candidate corresponding to the one with the greatest absolute value among plural said altitude amount candidates as said altitude amount; and
      (c-1-4) determining said film thickness increment or decrement on the basis of said altitude amount, and
      the absolute value of said film thickness increment r decrement is greater when the absolute value of said altitude amount is greater in said step (c-1-4), and the sign of the altitude amount and the sign of said film thickness increment or decrement are different from each other.

17. The method of making a mask pattern or claim 16, wherein said step (c-1-3) comprises a step of (c-1-3-1)

taking the one with the greatest absolute value among said plural slope amount candidates as said slope amount, and said film thickness increment or decrement is determined also on the basis of said slope amount in said step (c-1-4), and the absolute value of said film thickness increment or decrement is greater when the absolute value of said slope amount is greater.

18. The method of making a mask pattern of claim 16, wherein said steps (b-3), (b-4), (c-1-1), and (c-1-2) are executed also in the first and second directions orthogonal to each other in a stretching plane of said direction I and direction J crossing at an equal angle with both said direction I and direction J.

19. The method of making a mask pattern of claim 13, wherein said actual pattern is provided by forming a resist on said object, and shaping said resist according to said mask pattern by exposure and development, and said step (c) includes the step of simulating said shaping.

* * * * *